(12) United States Patent
Cho et al.

(10) Patent No.: US 12,143,795 B2
(45) Date of Patent: Nov. 12, 2024

(54) SPEAKER WITH POROUS SHEET AND ELECTRONIC DEVICE INCLUDING THE SAME

(71) Applicant: Samsung Electronics Co., Ltd., Suwon-si (KR)

(72) Inventors: Joonrae Cho, Suwon-si (KR); Myeungseon Kim, Suwon-si (KR); Myungcheol Lee, Suwon-si (KR); Kiwon Kim, Suwon-si (KR); Hunki Lee, Suwon-si (KR); Woojin Cho, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 99 days.

(21) Appl. No.: 17/965,378

(22) Filed: Oct. 13, 2022

(65) Prior Publication Data

US 2023/0033112 A1    Feb. 2, 2023

Related U.S. Application Data

(63) Continuation of application No. PCT/KR2022/010677, filed on Jul. 21, 2022.

(30) Foreign Application Priority Data

Aug. 2, 2021    (KR) .................. 10-2021-0101419

(51) Int. Cl.
*H04R 9/06*    (2006.01)
*H04R 1/02*    (2006.01)
(Continued)

(52) U.S. Cl.
CPC .............. *H04R 9/04* (2013.01); *H04R 1/025* (2013.01); *H04R 1/28* (2013.01); *H04R 1/2811* (2013.01);
(Continued)

(58) Field of Classification Search
CPC ........ H04R 1/025; H04R 1/28; H04R 1/2811; H04R 1/288; H04R 9/02; H04R 9/04;
(Continued)

(56) References Cited

U.S. PATENT DOCUMENTS 10,244,309 B2 * 3/2019 Kobayashi ............. H04R 1/021
10,567,869 B2    2/2020 Cao et al.
(Continued)

FOREIGN PATENT DOCUMENTS

KR    10-2017-0081136 A    7/2017
KR    10-2019-0072620 A    6/2019
(Continued)

OTHER PUBLICATIONS

International Search Report dated Oct. 21, 2022, issued in the corresponding PCT application No. PCT/KR2022/010677.
(Continued)

*Primary Examiner* — Huyen D Le
(74) *Attorney, Agent, or Firm* — Jefferson IP Law, LLP

(57) ABSTRACT

An electronic device including a speaker with a porous sheet, a speaker is provided. The electronic device includes a main body, a sound generator, which includes a voice coil, a sound body surrounding the voice coil, and a terminal that is at least partially exposed to an outside of the sound body, a printed circuit board (PCB) connected to the terminal and extending outwardly from the main body, and a porous sheet inserted into the main body and spaced apart from the terminal.

23 Claims, 22 Drawing Sheets

(51) Int. Cl.
*H04R 1/28* (2006.01)
*H04R 9/04* (2006.01)
*H05K 1/18* (2006.01)

(52) U.S. Cl.
CPC ............... *H04R 1/288* (2013.01); *H04R 9/06* (2013.01); *H05K 1/182* (2013.01); *H04R 2499/11* (2013.01)

(58) Field of Classification Search
CPC ...... H04R 9/045; H04R 9/06; H04R 2499/11; H05K 1/182; H04M 1/0277; H04M 1/03
See application file for complete search history.

(56) References Cited

U.S. PATENT DOCUMENTS

| | | |
|---|---|---|
| 2009/0120715 A1 | 5/2009 | Saiki |
| 2010/0329494 A1 | 12/2010 | Rouvala et al. |
| 2013/0170687 A1 | 7/2013 | Papakyriacou et al. |
| 2013/0170690 A1 | 7/2013 | Backman |
| 2017/0195781 A1* | 7/2017 | Kang ................. B01J 20/28004 |
| 2018/0234772 A1* | 8/2018 | Meng ....................... H04R 7/12 |
| 2021/0037321 A1 | 2/2021 | Shuzhi |

FOREIGN PATENT DOCUMENTS

| | | |
|---|---|---|
| KR | 10-2021-0015556 A | 2/2021 |
| KR | 10-2021-0015557 A | 2/2021 |
| KR | 10-2021-0017002 A | 2/2021 |
| WO | 2018/214280 A1 | 11/2018 |

OTHER PUBLICATIONS

European Search Report dated Sep. 19, 2024, issued in European Application No. 22853314.7.

* cited by examiner

SPEAKER WITH POROUS SHEET AND ELECTRONIC DEVICE INCLUDING THE SAME

CROSS-REFERENCE TO RELATED APPLICATION(S)

This application is a continuation application, claiming priority under § 365(c), of an International Application No. PCT/KR2022/010677, filed on Jul. 21, 2022, which is based on and claims the benefit of a Korean patent application number 10-2021-0101419, filed on Aug. 2, 2021, in the Korean Intellectual Property Office, the disclosure of which is incorporated by reference herein in its entirety.

BACKGROUND

1. Field

The disclosure relates to a speaker including a porous sheet, and an electronic device including the speaker.

2. Description of Related Art

A speaker that converts electrical energy into mechanical energy and/or acoustic energy may reproduce sound in a manner of generating a compression wave of air through a vertical motion of a diaphragm. Phases of sounds generated from a front surface and a rear surface of the diaphragm are opposite to each other, and a front space and a rear space need to be separated from each other based on the diaphragm to prevent destructive interference of the sounds generated from the front surface and the rear surface. In order to prevent a sound having a phase opposite to that of a sound generated from the front surface of the diaphragm from leaking to the outside, the rear space may be designed to have a closed structure.

The above information is presented as background information only to assist with an understanding of the disclosure. No determination has been made, and no assertion is made, as to whether any of the above might be applicable as prior art with regard to the disclosure.

SUMMARY

Due to a closed structure of a space in which a diaphragm is disposed, an amplitude of the diaphragm may be limited, which may lead to a reduction in a performance and quality of a speaker. If the space in which the diaphragm is disposed does not have a sufficient size, a movement of the diaphragm may be restricted by air in a confined space, thereby reducing a sound performance of the speaker. There is a desire for a technology to maximize the sound performance in a closed space of a limited size.

Aspects of the disclosure are to address at least the above-mentioned problems and/or disadvantages and to provide at least the advantages described below. Accordingly, an aspect of the disclosure is to provide a speaker that may increase a sound performance in a closed space of a limited size and an electronic device including the speaker.

Additional aspects will be set forth in part in the description which follows and, in part, will be apparent from the description, or may be learned by practice of the presented embodiments.

In accordance with an aspect of the disclosure, an electronic device including a speaker with a porous sheet, a speaker 310 is provided. The electronic device includes a main body 320, a sound generator 350, which includes a voice coil 353, a sound body 351 surrounding the voice coil and a terminal 354 that is at least partially exposed to the outside of the sound body, a printed circuit board (PCB) 360 connected to the terminal and extending outwardly from the main body, and a porous sheet 330 inserted into the main body and spaced apart from the terminal.

In accordance with another aspect of the disclosure, a speaker 310 with a porous sheet is provided. The speaker 310 includes a main body 320, a sound generator 350, which includes a voice coil, a sound body surrounding the voice coil, and a terminal that is at least partially exposed to the outside of the sound body, a PCB 360, which includes a contact part connected to the terminal and an extension part extending from the contact part, a porous sheet 330 inserted into the main body, a cover 340 connected to the main body to cover the porous sheet, and a non-conductive part 370 disposed between the PCB and the porous sheet.

In accordance with another aspect of the disclosure, an electronic device including a speaker with a porous sheet, a speaker 310 is provided. The electronic device includes a main body 320, which includes a base plate and an outer wall formed to protrude from the base plate, a sound generator 350, which includes a voice coil, a sound body surrounding the voice coil, and a terminal at least partially exposed to the outside of the sound body, a PCB 360 connected to the terminal and extending to the outside of the main body, a porous sheet 330 inserted into the main body and surrounded by the outer wall, a cover 340 connected to the main body to cover the porous sheet, and a non-conductive part 370 disposed between the PCB and the porous sheet to block a contact between the PCB and the porous sheet.

According to various example embodiments of the disclosure, a porous material capable of performing an air adsorption function may be disposed inside a main body, and thus it is possible to reduce a phenomenon in which a movement of a diaphragm is restricted by air in the main body.

Various example embodiments of the disclosure may provide a structure in which a porous material is provided in a closed space to reduce a movement of the porous material in the closed space.

Various example embodiments of the disclosure may provide a non-conductive part between a PCB and a porous material to block the porous material from being electrically connected to a sound generator.

Other aspects, advantages, and salient features of the disclosure will become apparent to those skilled in the art from the following detailed description, which, taken in conjunction with the annexed drawings, discloses various embodiments of the disclosure.

BRIEF DESCRIPTION OF THE DRAWINGS

The above and other aspects, features, and advantages of certain embodiments of the disclosure will be more apparent from the following description taken in conjunction with the accompanying drawings, in which.

The same reference numerals are used to represent the same elements throughout the drawings.

DETAILED DESCRIPTION

The following description with reference to the accompanying drawings is provided to assist in a comprehensive understanding of various embodiments of the disclosure as defined by the claims and their equivalents. It includes various specific details to assist in that understanding but these are to be regarded as merely exemplary. Accordingly, those of ordinary skill in the art will recognize that various changes and modifications of the various embodiments described herein can be made without departing from the scope and spirit of the disclosure. In addition, descriptions of well-known functions and constructions may be omitted for clarity and conciseness.

The terms and words used in the following description and claims are not limited to the bibliographical meanings, but, are merely used by the inventor to enable a clear and consistent understanding of the disclosure. Accordingly, it should be apparent to those skilled in the art that the following description of various embodiments of the disclosure is provided for illustration purpose only and not for the purpose of limiting the disclosure as defined by the appended claims and their equivalents.

It is to be understood that the singular forms "a," "an," and "the" include plural referents unless the context clearly dictates otherwise. Thus, for example, reference to "a component surface" includes reference to one or more of such surfaces.

Figure 1:
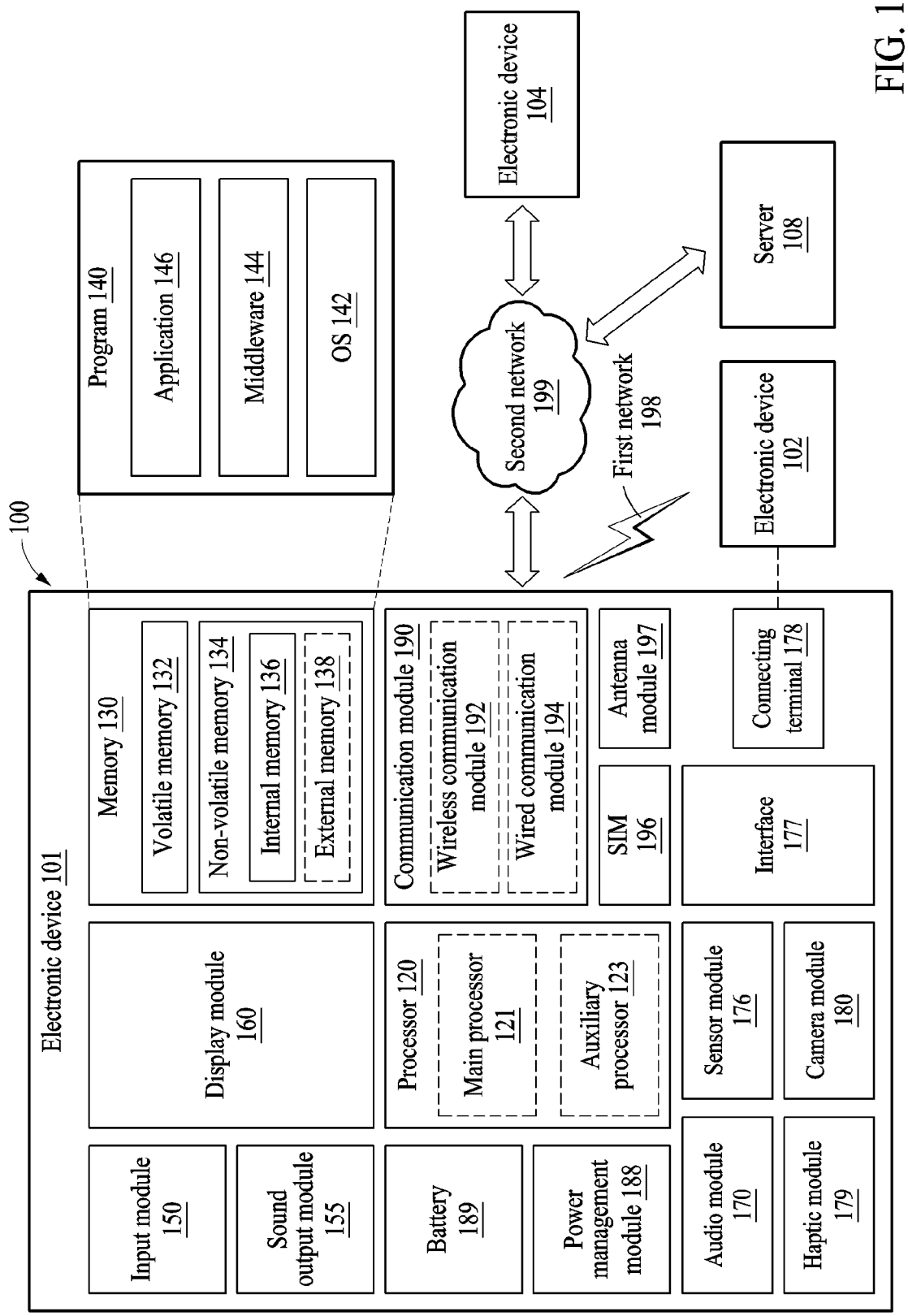
FIG. 1 is a block diagram of an electronic device in a network environment according to an embodiment of the disclosure.

FIG. 1 is a block diagram illustrating an electronic device in a network environment according to an embodiment of the disclosure.

Referring to FIG. 1, an electronic device 101 in a network environment 100 may communicate with an electronic device 102 via a first network 198 (e.g., a short-range wireless communication network), or communicate with at least one of an electronic device 104 or a server 108 via a second network 199 (e.g., a long-range wireless communication network). According to an embodiment, the electronic device 101 may communicate with the electronic device 104 via the server 108. According to an embodiment, the electronic device 101 may include a processor 120, a memory 130, an input module 150, a sound output module 155, a display module 160, an audio module 170, and a sensor module 176, an interface 177, a connecting terminal 178, a haptic module 179, a camera module 180, a power management module 188, a battery 189, a communication module 190, a subscriber identification module (SIM) 196, or an antenna module 197. In some embodiments, at least one (e.g., the connecting terminal 178) of the above components may be omitted from the electronic device 101, or one or more other components may be added in the electronic device 101. In some embodiments, some (e.g., the sensor module 176, the camera module 180, or the antenna module 197) of the components may be integrated as a single component (e.g., the display module 160).

The processor 120 may execute, for example, software (e.g., a program 140) to control at least one other component (e.g., a hardware or software component) of the electronic device 101 connected to the processor 120, and may perform various data processing or computation. According to an embodiment, as at least a part of data processing or computation, the processor 120 may store a command or data received from another component (e.g., the sensor module 176 or the communication module 190) in a volatile memory 132, process the command or the data stored in the volatile memory 132, and store resulting data in a non-volatile memory 134. According to an embodiment, the processor 120 may include a main processor 121 (e.g., a central processing unit (CPU) or an application processor (AP)) or an auxiliary processor 123 (e.g., a graphics processing unit (GPU), a neural processing unit (NPU), an image signal processor (ISP), a sensor hub processor, or a communication processor (CP)) that is operable independently of, or in conjunction with the main processor 121. For example, when the electronic device 101 includes the main processor 121 and the auxiliary processor 123, the auxiliary processor 123 may be adapted to consume less power than the main processor 121 or to be specific to a specified function. The auxiliary processor 123 may be implemented separately from the main processor 121 or as a part of the main processor 121.

The auxiliary processor 123 may control at least some of functions or states related to at least one (e.g., the display module 160, the sensor module 176, or the communication module 190) of the components of the electronic device 101, instead of the main processor 121 while the main processor 121 is in an inactive (e.g., sleep) state or along with the main processor 121 while the main processor 121 is an active state (e.g., executing an application). According to another embodiment, the auxiliary processor 123 (e.g., an ISP or a CP) may be implemented as a portion of another component (e.g., the camera module 180 or the communication module 190) that is functionally related to the auxiliary processor 123. According to yet another embodiment, the auxiliary processor 123 (e.g., an NPU) may include a hardware structure specified for artificial intelligence (AI) model processing. An artificial intelligence model may be generated by machine learning. Such learning may be performed by, for example, the electronic device 101 in which artificial intelligence is performed, or performed via a separate server (e.g., the server 108). Learning algorithms may include, but are not limited to, for example, supervised learning, unsupervised learning, semi-supervised learning, or reinforcement learning. The AI model may include a plurality of artificial neural network layers. An artificial neural network may include, for example, a deep neural network (DNN), a convolutional neural network (CNN), a recurrent neural network (RNN), a restricted Boltzmann machine (RBM), a deep belief network (DBN), and a bidirectional recurrent deep neural network (BRDNN), a deep Q-network, or a combination of two or more thereof, but is not limited thereto. The AI model may additionally or alternatively include a software structure other than the hardware structure.

The memory 130 may store various data used by at least one component (e.g., the processor 120 or the sensor module 176) of the electronic device 101. The various data may include, for example, software (e.g., the program 140) and input data or output data for a command related thereto. The memory 130 may include the volatile memory 132 or the non-volatile memory 134.

The program 140 may be stored as software in the memory 130, and may include, for example, an operating system (OS) 142, middleware 144, or an application 146.

The input module 150 may receive a command or data to be used by another component (e.g., the processor 120) of the electronic device 101, from the outside (e.g., a user) of the electronic device 101. The input module 150 may include, for example, a microphone, a mouse, a keyboard, a key (e.g., a button), or a digital pen (e.g., a stylus pen).

The sound output module 155 may output a sound signal to the outside of the electronic device 101. The sound output module 155 may include, for example, a speaker or a receiver. The speaker may be used for general purposes, such as playing multimedia or playing record. The receiver may be used to receive an incoming call. According to yet another embodiment, the receiver may be implemented separately from the speaker or as a part of the speaker.

The display module 160 may visually provide information to the outside (e.g., a user) of the electronic device 101. The display module 160 may include, for example, a control circuit for controlling a display, a hologram device, or a projector and control circuitry to control a corresponding one of the display, the hologram device, and the projector. According to yet another embodiment, the display module 160 may include a touch sensor adapted to sense a touch, or a pressure sensor adapted to measure an intensity of a force incurred by the touch.

The audio module 170 may convert a sound into an electric signal or vice versa. According to yet another embodiment, the audio module 170 may obtain the sound via the input module 150 or output the sound via the sound output module 155 or an external electronic device (e.g., an electronic device 102 such as a speaker or a headphone) directly or wirelessly connected to the electronic device 101.

The sensor module 176 may detect an operational state (e.g., power or temperature) of the electronic device 101 or an environmental state (e.g., a state of a user) external to the electronic device 101, and generate an electric signal or data value corresponding to the detected state. According to yet another embodiment, the sensor module 176 may include, for example, a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 177 may support one or more specified protocols to be used for the electronic device 101 to be coupled with the external electronic device (e.g., the electronic device 102) directly (e.g., wiredly) or wirelessly. According to yet another embodiment, the interface 177 may include, for example, a high-definition multimedia interface (HDMI), a universal serial bus (USB) interface, a secure digital (SD) card interface, or an audio interface.

The connecting terminal 178 may include a connector via which the electronic device 101 may be physically connected to an external electronic device (e.g., the electronic device 102). According to yet another embodiment, the connecting terminal 178 may include, for example, an HDMI connector, a USB connector, an SD card connector, or an audio connector (e.g., a headphone connector).

The haptic module 179 may convert an electric signal into a mechanical stimulus (e.g., a vibration or a movement) or an electrical stimulus which may be recognized by a user via his or her tactile sensation or kinesthetic sensation. According to yet another embodiment, the haptic module 179 may include, for example, a motor, a piezoelectric element, or an electric stimulator.

The camera module 180 may capture a still image and moving images. According to yet another embodiment, the camera module 180 may include one or more lenses, image sensors, ISPs, or flashes.

The power management module 188 may manage power supplied to the electronic device 101. According to yet another embodiment, the power management module 188 may be implemented as, for example, at least a part of a power management integrated circuit (PMIC).

The battery 189 may supply power to at least one component of the electronic device 101. According to yet another embodiment, the battery 189 may include, for example, a primary cell which is not rechargeable, a secondary cell which is rechargeable, or a fuel cell.

The communication module 190 may support establishing a direct (e.g., wired) communication channel or a wireless communication channel between the electronic device 101 and the external electronic device (e.g., the electronic device 102, the electronic device 104, or the server 108) and performing communication via the established communication channel. The communication module 190 may include one or more communication processors that are operable independently of the processor 120 (e.g., an AP) and that support a direct (e.g., wired) communication or a wireless communication. According to yet another embodiment, the communication module 190 may include a wireless communication module 192 (e.g., a cellular communication module, a short-range wireless communication module, or a global navigation satellite system (GNSS) communication module) or a wired communication module 194 (e.g., a local region network (LAN) communication module, or a power line communication (PLC) module). A corresponding one of these communication modules may communicate with the external electronic device 104 via the first network 198 (e.g., a short-range communication network, such as Bluetooth™, wireless-fidelity (Wi-Fi) direct, or infrared data association (IrDA)) or the second network 199 (e.g., a long-range communication network, such as a legacy cellular network, a 5th generation (5G) network, a next-generation communication network, the Internet, or a computer network (e.g., a LAN or a wide region network (WAN)). These various types of communication modules may be implemented as a single component (e.g., a single chip), or may be implemented as multi components (e.g., multi chips) separate from each other. The wireless communication module 192 may identify and authenticate the electronic device 101 in a communication network, such as the first network 198 or the second network 199, using subscriber information (e.g., international mobile subscriber identity (IMSI)) stored in the SIM 196.

The wireless communication module 192 may support a 5G network after a 4th generation (4G) network, and a next-generation communication technology, e.g., a new radio (NR) access technology. The NR access technology may support enhanced mobile broadband (eMBB), massive machine type communications (mMTC), or ultra-reliable and low-latency communications (URLLC). The wireless communication module 192 may support a high-frequency band (e.g., a mmWave band) to achieve, e.g., a high data transmission rate. The wireless communication module 192 may support various technologies for securing performance on a high-frequency band, such as, e.g., beamforming, massive multiple-input and multiple-output (MIMO), full dimensional MIMO (FD-MIMO), an array antenna, analog beam-forming, or a large scale antenna. The wireless communication module 192 may support various requirements specified in the electronic device 101, an external electronic device (e.g., the electronic device 104), or a network system (e.g., the second network 199). According to yet another embodiment, the wireless communication module 192 may support a peak data rate (e.g., 20 Gbps or more) for implementing eMBB, loss coverage (e.g., 164 dB or less) for implementing mMTC, or U-plane latency (e.g., 0.5 ms or less for each of downlink (DL) and uplink (UL), or a round trip of 1 ms or less) for implementing URLLC.

The antenna module 197 may transmit or receive a signal or power to or from the outside (e.g., the external electronic device) of the electronic device 101. According to yet another embodiment, the antenna module 197 may include an antenna including a radiating element including a conductive material or a conductive pattern formed in or on a substrate (e.g., a printed circuit board (PCB)). According to yet another embodiment, the antenna module 197 may include a plurality of antennas (e.g., array antennas). In such a case, at least one antenna appropriate for a communication scheme used in a communication network, such as the first network 198 or the second network 199, may be selected by, for example, the communication module 190 from the plurality of antennas. The signal or the power may be transmitted or received between the communication module 190 and the external electronic device via the at least one selected antenna. According to yet another embodiment, another component (e.g., a radio frequency integrated circuit (RFIC)) other than the radiating element may be additionally formed as a part of the antenna module 197.

According to various example embodiments, the antenna module 197 may form a mmWave antenna module. According to yet another embodiment, the mmWave antenna module may include a PCB, an RFIC disposed on a first surface (e.g., a bottom surface) of the PCB or adjacent to the first surface and capable of supporting a designated a high-frequency band (e.g., the mmWave band), and a plurality of antennas (e.g., array antennas) disposed on a second surface (e.g., a top or a side surface) of the PCB, or adjacent to the second surface and capable of transmitting or receiving signals in the designated high-frequency band.

At least some of the above-described components may be coupled mutually and communicate signals (e.g., commands or data) therebetween via an inter-peripheral communication scheme (e.g., a bus, general purpose input and output (GPIO), serial peripheral interface (SPI), or mobile industry processor interface (MIPI)).

According to yet another embodiment, commands or data may be transmitted or received between the electronic device 101 and the external electronic device 104 via the server 108 coupled with the second network 199. Each of the external electronic devices 102 or 104 may be a device of the same type as or a different type from the electronic device 101. According to yet another embodiment, all or some of operations to be executed by the electronic device 101 may be executed at one or more external electronic devices (e.g., the external devices 102 and 104, and the server 108). For example, if the electronic device 101 needs to perform a function or a service automatically, or in response to a request from a user or another device, the electronic device 101, instead of, or in addition to, executing the function or the service, may request one or more external electronic devices to perform at least part of the function or the service. The one or more external electronic devices receiving the request may perform the at least part of the function or the service requested, or an additional function or an additional service related to the request, and may transfer an outcome of the performing to the electronic device 101. The electronic device 101 may provide the outcome, with or without further processing of the outcome, as at least part of a reply to the request. To that end, a cloud computing, distributed computing, mobile edge computing (MEC), or client-server computing technology may be used, for example. The electronic device 101 may provide ultra low-latency services using, e.g., distributed computing or mobile edge computing. In yet another embodiment, the external electronic device 104 may include an Internet-of-things (IoT) device. The server 108 may be an intelligent server using machine learning and/or a neural network. According to yet another embodiment, the external electronic device 104 or the server 108 may be included in the second network 199. The electronic device 101 may be applied to intelligent services (e.g., smart home, smart city, smart car, or healthcare) based on 5G communication technology or IoT-related technology.

The electronic device according to various example embodiments may be one of various types of electronic devices. The electronic device may include, for example, a portable communication device (e.g., a smartphone), a computer device, a portable multimedia device, a portable medical device, a camera, a wearable device, or a home appliance device. According to yet another embodiment of the disclosure, the electronic device is not limited to those described above.

It should be appreciated that various example embodiments of the disclosure and the terms used therein are not intended to limit the technological features set forth herein to particular example embodiments and include various changes, equivalents, or replacements for a corresponding example embodiment. In connection with the description of the drawings, like reference numerals may be used for similar or related components. As used herein, "A or B", "at least one of A and B", "at least one of A or B", "A, B or C", "at least one of A, B and C", and "A, B, or C," each of which may include any one of the items listed together in the corresponding one of the phrases, or all possible combinations thereof. Terms such as "first", "second", or "first" or "second" may simply be used to distinguish the component from other components in question, and do not limit the components in other aspects (e.g., importance or order). It is to be understood that if an element (e.g., a first element) is referred to, with or without the term "operatively" or "communicatively", as "coupled with," "coupled to," "connected with," or "connected to" another element (e.g., a second element), it means that the element may be coupled with the other element directly (e.g., wiredly), wirelessly, or via a third element.

As used in connection with various example embodiments of the disclosure, the term "module" may include a unit implemented in hardware, software, or firmware, and may interchangeably be used with other terms, for example, "logic," "logic block," "part," or "circuitry". A module may be a single integral component, or a minimum unit or part thereof, adapted to perform one or more functions. For example, according to yet another embodiment, the module may be implemented in a form of an application-specific integrated circuit (ASIC).

Various example embodiments as set forth herein may be implemented as software (e.g., the program 140) including one or more instructions that are stored in a storage medium (e.g., an internal memory 136 or an external memory 138) that is readable by a machine (e.g., the electronic device 101) For example, a processor (e.g., the processor 120) of the machine (e.g., the electronic device 101) may invoke at least one of the one or more instructions stored in the storage medium, and execute it. This allows the machine to be operated to perform at least one function according to the at least one instruction invoked. The one or more instructions may include a code generated by a complier or a code executable by an interpreter. The machine-readable storage medium may be provided in the form of a non-transitory storage medium. Here, the term "non-transitory" simply means that the storage medium is a tangible device, and does not include a signal (e.g., an electromagnetic wave), but this term does not differentiate between where data is semi-permanently stored in the storage medium and where the data is temporarily stored in the storage medium.

According to yet another embodiment, a method according to various example embodiments of the disclosure may be included and provided in a computer program product. The computer program product may be traded as a product between a seller and a buyer. The computer program product may be distributed in the form of a machine-readable storage medium (e.g., compact disc read-only memory (CD-ROM)), or be distributed (e.g., downloaded or uploaded) online via an application store (e.g., PlayStore™), or between two user devices (e.g., smartphones) directly. If distributed online, at least part of the computer program product may be temporarily generated or at least temporarily stored in the machine-readable storage medium, such as memory of the manufacturer's server, a server of the application store, or a relay server.

According to various example embodiments, each component (e.g., a module or a program) of the above-described components may include a single entity or multiple entities, and some of the multiple entities may be separately disposed in different components. According to various example embodiments, one or more of the above-described components may be omitted, or one or more other components may be added. Alternatively or additionally, a plurality of components (e.g., modules or programs) may be integrated into a single component. In such a case, according to various example embodiments, the integrated component may still perform one or more functions of each of the plurality of components in the same or similar manner as they are performed by a corresponding one of the plurality of components before the integration. According to various example embodiments, operations performed by the module, the program, or another component may be carried out sequentially, in parallel, repeatedly, or heuristically, or one or more of the operations may be executed in a different order or omitted, or one or more other operations may be added.

Figure 2A:
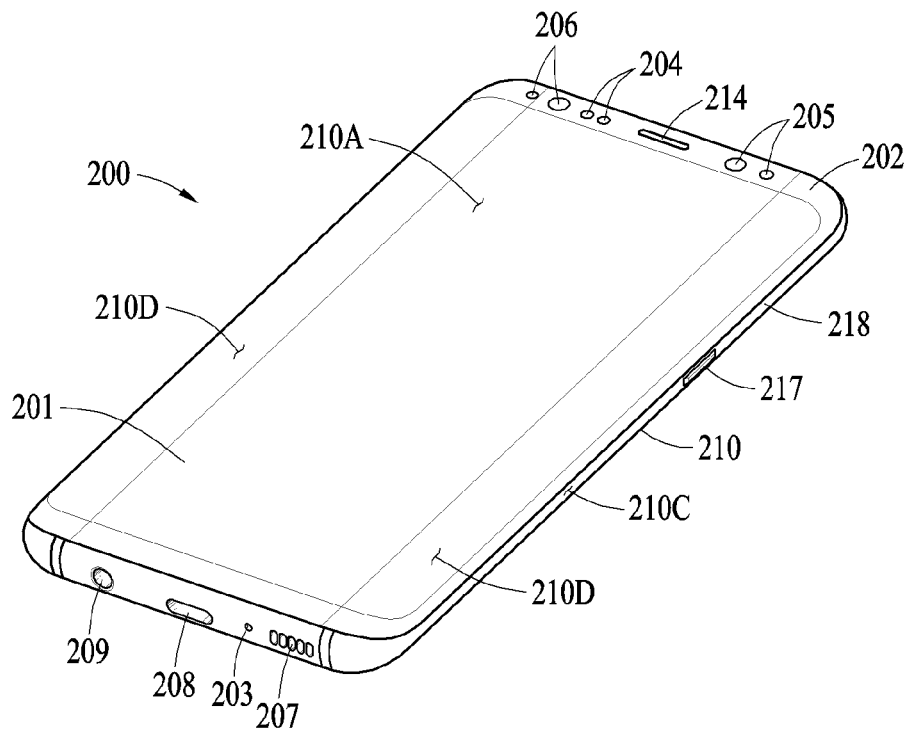
FIG. 2A is a perspective view of a front surface of a mobile electronic device according to an embodiment of the disclosure.

FIG. 2A is a perspective view of a front surface of a mobile electronic device according to an embodiment of the disclosure.

Figure 2B:
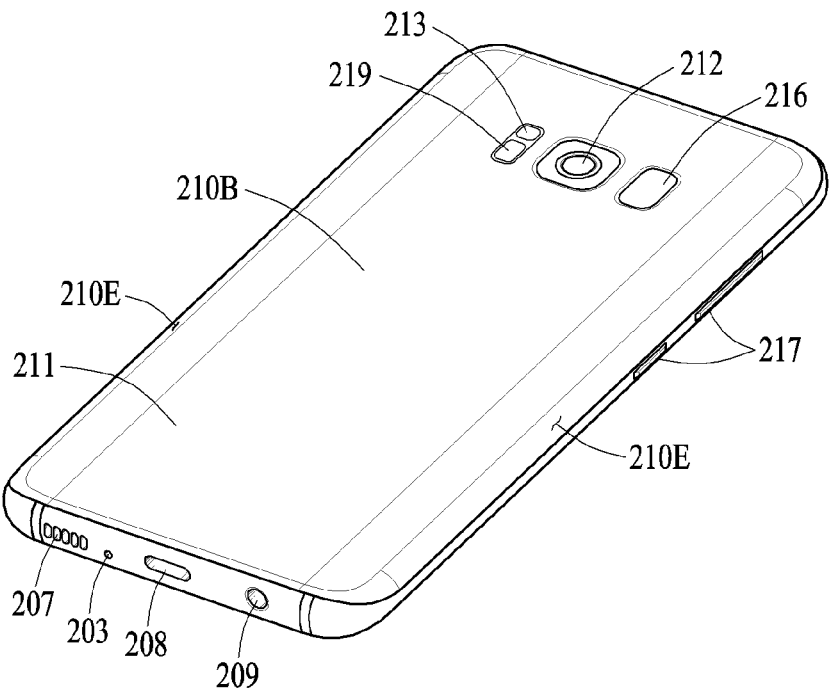
FIG. 2B is a perspective view of a rear surface of the electronic device of FIG. 2A according to an embodiment of the disclosure.

FIG. 2B is a perspective view of a rear surface of the electronic device of FIG. 2A according to an embodiment of the disclosure.

Referring to FIGS. 2A and 2B, an electronic device 200 according to an embodiment may include a housing 210 including a first surface (or a front surface) 210A, a second surface (or a rear surface) 210B, and a side surface 210C surrounding a space between the first surface 210A and the second surface 210B. In another embodiment (not shown), the housing may also refer to a structure which forms a portion of the first surface 210A, the second surface 210B, and the side surface 210C of FIGS. 2A and 2B. In yet another embodiment, the first surface 210A may be formed of a front plate 202 (e.g., a polymer plate or a glass plate including various coating layers) of which at least a portion is substantially transparent. The second surface 210B may be formed of a back plate 211 that is substantially opaque. For example, the back plate 211 may be formed of coated or colored glass, ceramic, polymer, metal materials (e.g., aluminum, stainless steel (SS), or magnesium) or a combination of at least two of the above materials. The side surface 210C may be coupled to the front plate 202 and the back plate 211 and may be formed by a side plate (or a "side member") 218 including metal and/or polymer. In some example embodiments, the back plate 211 and the side plate 218 may be integrally formed and may include the same material (e.g., a metal material such as aluminum).

In the illustrated example embodiment, the front plate 202 may include two first areas 210D that are curved and extend seamlessly from the first surface 210A toward the back plate 211, at both ends of a long edge of the front plate 202. In the illustrated example embodiment, the back plate 211 may include two second areas 210E that are curved and extend seamlessly from the second surface 210B toward the front plate 202, at both ends of a long edge thereof. In some example embodiments, the front plate 202 (or the back plate 211) may include only one of the first areas 210D (or the second areas 210E). In yet another embodiment, some of the first areas 210D or the second areas 210E may not be included. In yet another embodiment, when viewed from a side surface of the electronic device 200, the side plate 218 may have a first thickness (or width) in a direction of a side surface not including the first areas 210D or the second areas 210E, and have a second thickness less than the first thickness in a direction of a side surface including the first areas 210D or the second areas 210E.

According to an embodiment, the electronic device 200 may include at least one of a display 201, audio modules 203, 207, and 214, sensor modules 204, 216, and 219, camera modules 205, 212, and 213, key input devices 217, a light-emitting element 206, and connector holes 208 and 209. In some example embodiments, the electronic device 200 may not include at least one (e.g., the key input devices 217 or the light-emitting element 206) of the components, or may additionally include other components.

The display 201 may be exposed through a substantial portion of the front plate 202, for example. In some example embodiments, at least a portion of the display 201 may be exposed through the front plate 202 that forms the first surface 210A and the first areas 210D of the side surface 210C. In some example embodiments, an edge of the display 201 may be formed to be substantially the same as the shape of the periphery of the front plate 202 adjacent thereto. In another example embodiment (not shown), in order to enlarge the exposed area of the display 201, a distance between the edge of the display 201 and the periphery of the front plate 202 may be substantially the same.

In yet another embodiment (not shown), a recess or an opening may be formed in a portion of a screen display area of the display 201, and at least one of the audio module 214, the sensor module 204, and the camera module 205, and the light-emitting element 206 that are aligned with the recess or the opening may be included. In yet another embodiment (not shown), a rear surface of the screen display area of the display 201 may include at least one of the audio module 214, the sensor module 204, the camera module 205, the sensor module 216 (e.g., a fingerprint sensor), and the light-emitting element 206. In yet another embodiment (not shown), the display 201 may be coupled to or disposed adjacent to a touch sensing circuit, a pressure sensor for measuring an intensity (pressure) of a touch, and/or a digitizer for detecting a magnetic-type stylus pen. In some example embodiments, at least a portion of the sensor modules 204 and 219, and/or at least a portion of the key input device 217 may be disposed in the first areas 210D and/or the second areas 210E.

The audio modules 203, 207, and 214 may include a plate hole 203, speaker holes 207 and 214, and a microphone (not shown) provided in the housing 210. The microphone hole 203 may guide a sound from the outside to the microphone. The speaker holes 207 and 214 may include an external speaker hole 207 and a receiver hole for call 214. In some example embodiments, the speaker holes 207 and 214 and the plate hole 203 may be implemented as a single hole, or a speaker (e.g., a piezo speaker) may be included without the speaker holes 207 and 214.

The sensor modules 204, 216, and 219 may generate an electrical signal or a data value corresponding to an internal operating state of the electronic device 200 or an external environmental state. The sensor modules 204, 216, and 219 may include, for example, a first sensor module 204 (e.g., a proximity sensor) and/or a second sensor module (not shown) (e.g., a fingerprint sensor) disposed on the first surface 210A of the housing 210, and/or a third sensor module 219 (e.g., a heart rate monitoring (HRM) sensor) and/or a fourth sensor module 216 (e.g., a fingerprint sensor) disposed on the second surface 210B of the housing 210. The fingerprint sensor may be disposed on both the first surface 210A (e.g., the display 201) and the second surface 210B of the housing 210. The electronic device 200 may further include at least one of sensor modules (not shown), for example, a gesture sensor, a gyro sensor, an atmospheric pressure sensor, a magnetic sensor, an acceleration sensor, a grip sensor, a color sensor, an infrared (IR) sensor, a biometric sensor, a temperature sensor, a humidity sensor, and an illuminance sensor.

The camera modules 205, 212, and 213 may include a first camera device 205 disposed on the first surface 210A of the electronic device 200, a second camera device 212 disposed on the second surface 210B, and/or a flash 213. The camera modules 205 and 212 may each include one or more lenses, an image sensor, and/or an image signal processor. A flash 213 may include, for example, a light-emitting diode (LED) or a xenon lamp. In some example embodiments, two or more lenses (e.g., infrared camera, wide-angle, and telephoto lenses) and image sensors may be disposed on one surface of the electronic device 200.

The key input devices 217 may be disposed on the side surface 210C of the housing 210. In yet another embodiment, the electronic device 200 may not include a portion or entirety of the key input devices 217 mentioned above, and the key input device 217 that is not included may be implemented in another form such as a soft key on the display 201. In some example embodiments, the key input devices 217 may include the sensor module 216 disposed on the second surface 210B of the housing 210.

The light-emitting element 206 may be disposed on, for example, the first surface 210A of the housing 210. The light-emitting element 206 may provide, for example, state information of the electronic device 200 in the form of light. In yet another embodiment, the light-emitting element 206 may provide, for example, a light source that is linked to the operation of the camera module 205. The light-emitting element 206 may include, for example, an LED, an IR LED, and a xenon lamp.

The connector holes 208 and 209 may include a first connector hole 208 for accommodating a connector (e.g., a universal serial bus (USB) connector) for transmitting and receiving power and/or data to and from an external electronic device, and/or a second connector hole 209 (e.g., an earphone jack) for accommodating a connector for transmitting and receiving an audio signal to and from an external electronic device.

Figure 3A:
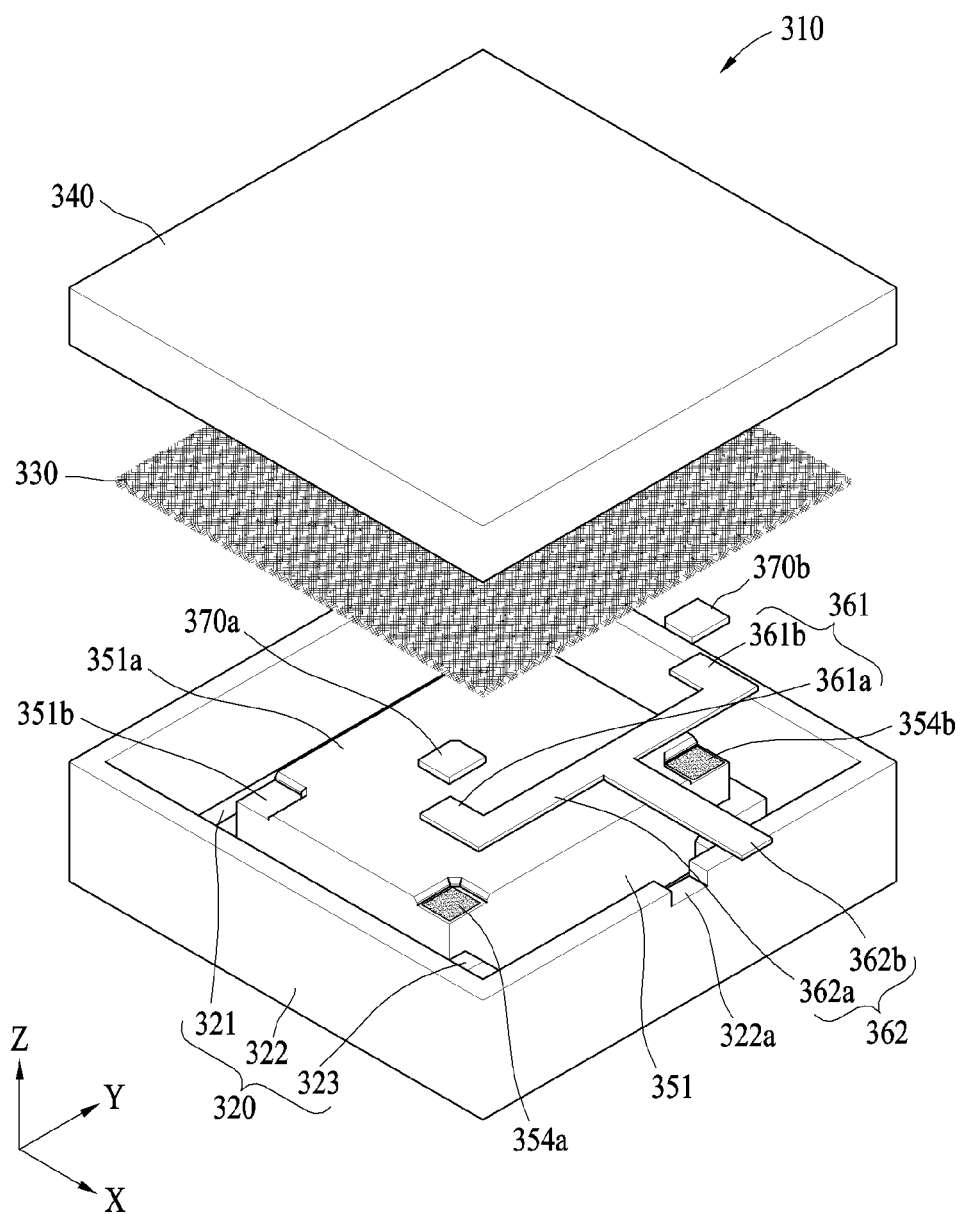
FIG. 3A is an exploded perspective view of a speaker including a porous sheet according to an embodiment of the disclosure.

FIG. 3A is an exploded perspective view of a speaker including a porous sheet according to an embodiment of the disclosure.

Figure 3B:
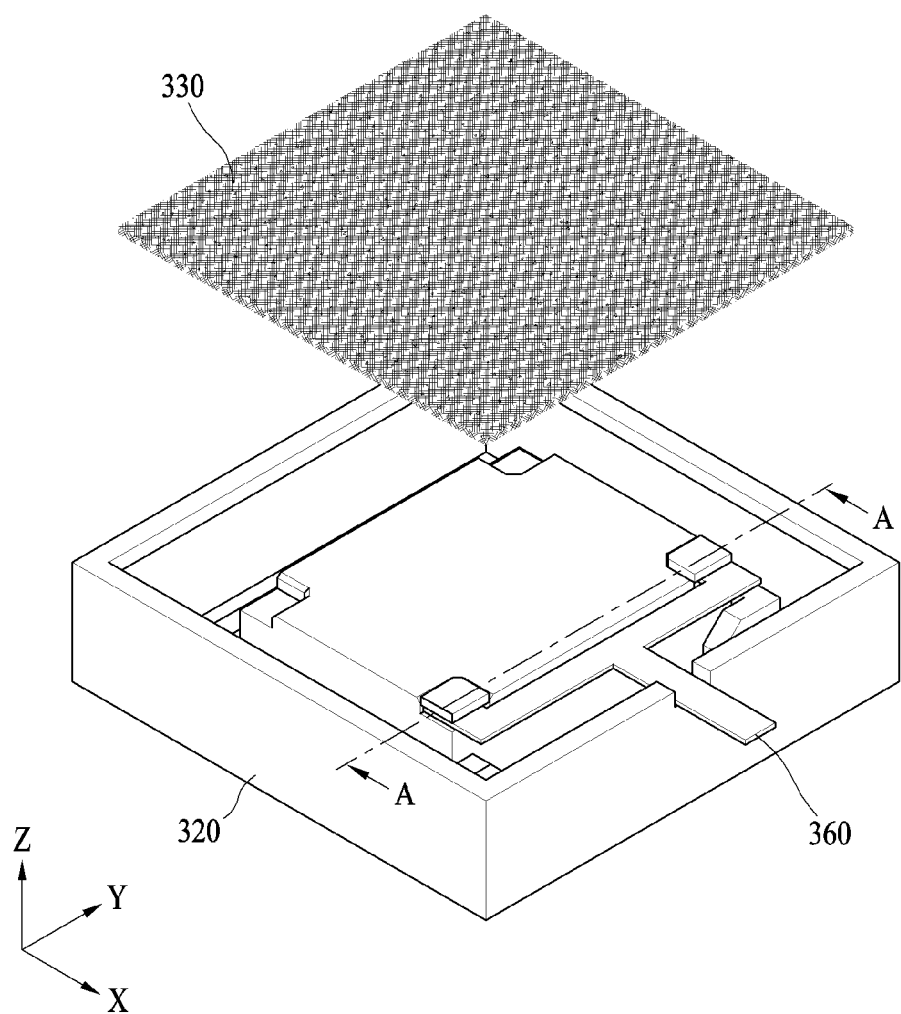
FIG. 3B is a perspective view of a speaker including a porous sheet with a cover omitted according to an embodiment of the disclosure.

FIG. 3B is a perspective view of a speaker including a porous sheet with a cover omitted according to an embodiment of the disclosure.

Figure 3C:
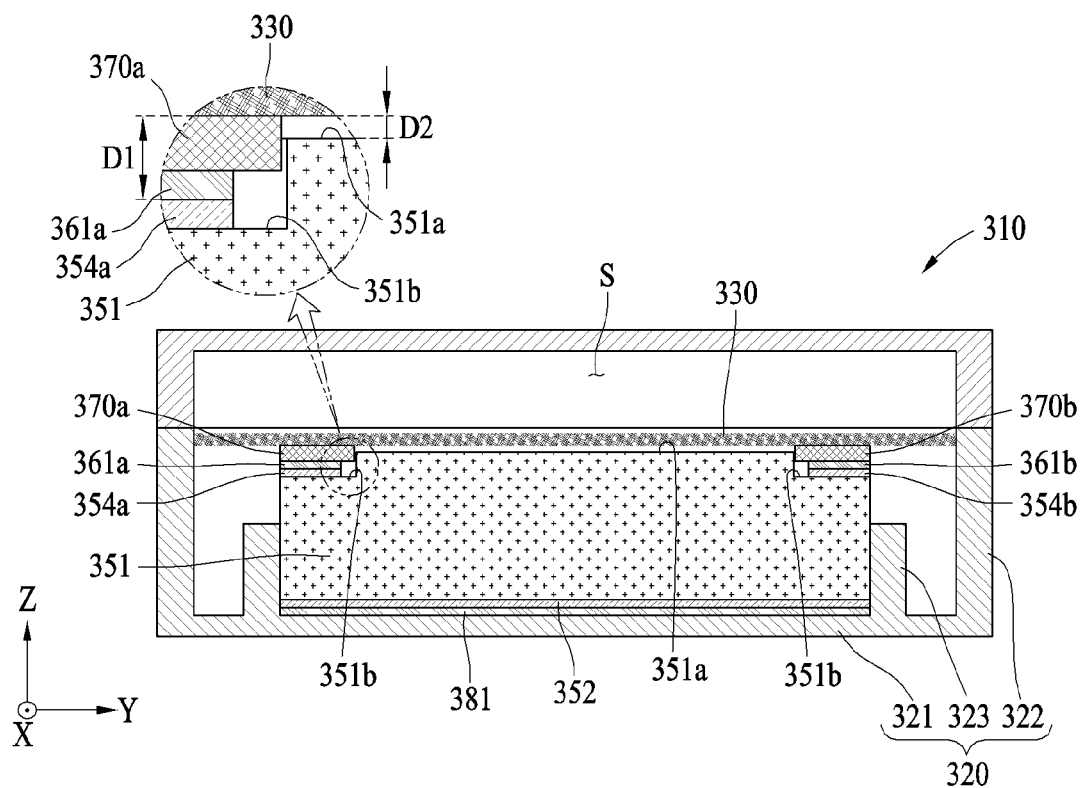
FIG. 3C is a cross-sectional view of a speaker including a porous sheet taken along line A-A of FIG. 3B according to an embodiment of the disclosure.

FIG. 3C is a cross-sectional view of a speaker including a porous sheet taken along line A-A of FIG. 3B according to an embodiment of the disclosure.

Figure 3D:
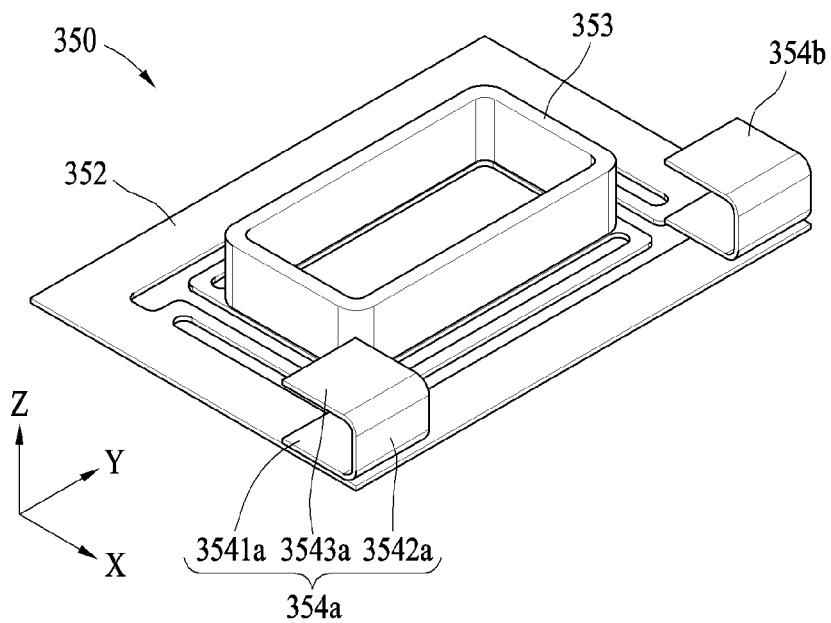
FIG. 3D is a perspective view of a sound generator with a sound body omitted according to an embodiment of the disclosure.

FIG. 3D is a perspective view of a sound generator with a sound body omitted according to an embodiment of the disclosure.

Referring to FIGS. 3A, 3B, 3C, and 3D, in an embodiment, an electronic device (e.g., the electronic device 101 of FIG. 1, the electronic device 200 of FIG. 2A) may include a sound output module (e.g., the sound output module 155 of FIG. 1) including a speaker 310. A sound generated by the speaker 310 may be guided to the outside through speaker holes (e.g., the speaker holes 207 and 214 of FIG. 2A). The speaker 310 may be included in a terminal-type electronic device (e.g., the electronic device 200 of FIG. 2A), for example, a mobile phone, a tablet, or a desktop, as well as a sound system using a dynamic speaker, for example, a headset, a television (TV) or a home theater. However, it is noted that an electronic device including the speaker 310 is not limited thereto.

The speaker 310 may include a main body 320, a porous sheet 330 inserted into the main body 320, a cover 340 connected to the main body 320 to cover the porous sheet 330, a sound generator 350 disposed inside the main body 320, a PCB 360 electrically connected to the sound generator 350, and a non-conductive part 370 disposed between the PCB 360 and the porous sheet 330.

The main body 320 may be disposed in a space enclosed by a front plate (e.g., the front plate 202 of FIG. 2A), a side plate (e.g., the side plate 218 of FIG. 2A), and a back plate (e.g., the back plate 211 of FIG. 2B). The main body 320 may include a base plate 321, an outer wall 322 formed to protrude from the base plate 321, and an inner wall 323 that protrudes from the base plate 321 and that is disposed on an inside of the outer wall 322.

The base plate 321 may support the sound generator 350. The base plate 321 may include a main hole (not shown) for exposing at least a portion of the sound generator 350 to the outside. The main hole may be formed to penetrate the base plate 321 in a z-axis direction. One surface of the sound generator 350 may be exposed in a -z direction through the main hole. In the disclosure, it is noted that a +z direction and a -z direction indicate a front side and a rear side of a speaker, respectively. The sound generator 350 may include a diaphragm (not shown). A sound generated by vibration of the diaphragm may be transmitted to the outside of the main body 320 through the main hole of the base plate 321. The main hole of the base plate 321 may be closed by the sound generator 350.

The outer wall 322, together with the base plate 321 and the cover 340, may define an inner space of the speaker 310. The base plate 321 may have a shape of a plate disposed on an xy plane, and the outer wall 322 may have a shape of protruding from the base plate 321 in the +z direction. The outer wall 322 may be formed along an edge of the base plate 321. The outer wall 322 may surround the sound generator 350. A height of the outer wall 322 may be greater than a distance from the base plate 321 to a top surface of the sound generator 350. When the outer wall 322 is viewed in a direction, for example, an x-axis direction or a y-axis direction, crossing a direction in which the outer wall 322 protrudes, the sound generator 350 may be completely enclosed by the outer wall 322 and may not be exposed to the outside. The outer wall 322 may include a wall groove 322a to guide the PCB 360.

The inner wall 323 may protrude from the base plate 321 to support the sound generator 350. The inner wall 323 may support the sound generator 350 so that the sound generator 350 may not excessively move in the x-axis direction and/or the y-axis direction inside the main body 320. For example, the inner wall 323 may be formed to correspond to the shape of the sound generator 350, and the sound generator 350 may be fitted to the inner wall 323. A height of the inner wall 323 may be less than the height of the outer wall 322.

To prevent air of an inner space S of the speaker 310 from adversely affecting the performance of the sound generator 350, the porous sheet 330 may adsorb at least a portion of the air of the inner space S of the speaker 310. The porous sheet 330 may include an air adsorption material. For example, the porous sheet 330 may include an activated carbon-based material having a specific surface area of 1500 $m^2/g$ or greater. The porous sheet 330 may have a shape corresponding to an inner shape of the outer wall 322.

It is noted that although the porous sheet 330 having a shape of a quadrangular plate is illustrated, the shape of the porous sheet 330 is not limited thereto. For example, the porous sheet 330 may have a polygonal shape, such as a triangular shape or a pentagonal shape, or may have a circular shape or an oval shape.

It is noted that although the porous sheet 330 having all edges in contact with an inner wall of the main body 320 is illustrated, the example embodiments are not limited thereto. The porous sheet 330 may be shaped to restrict a movement of the porous sheet 330 in the x-axis direction and/or the y-axis direction within the main body 320. For example, the porous sheet 330 may be fitted to the outer wall 322. The porous sheet 330 may be movable in one degree of freedom along the main body 320. For example, the porous sheet 330 may be movable along the main body 320 in the z-axis direction, and a movement of the porous sheet 330 in the x-axis direction or the y-axis direction that is a direction crossing the z-axis direction may be restricted by the outer wall 322. If the porous sheet 330 moves in the x-axis direction and/or the y-axis direction, a collision between the porous sheet 330 and the main body 320, and noise generation may be reduced.

The porous sheet 330 may be shaped to include a plurality of micro-holes formed on an outer surface thereof and therein. The porous sheet 330 may adsorb air through the micro-holes. The plurality of micro-holes provided in the porous sheet 330 may have different diameters or different shapes. Some of the plurality of fine holes of the porous sheet 330 may have, for example, a spherical shape.

The cover 340 may be connected to the main body 320 and may cover the porous sheet 330. The cover 340 may be attached or coupled to the main body 320. The cover 340 and the main body 320 may form the inner space S of the speaker 310 that is sealed. For example, the cover 340 may be formed integrally with the main body 320. For example, if the cover 340 and the main body 320 are integrally formed, the cover 340 and/or the main body 320 may include a hole for accommodating the porous sheet 330, and the porous sheet 330 may enter the inner space S of the speaker 310 through the hole.

The sound generator 350 may generate a sound by receiving a signal from the outside. The sound generator 350 may output a sound by receiving an electric signal from the PCB 360. The sound generator 350 may include a sound body 351 constituting an exterior, a suspension 352 configured to support the sound body 351, a voice coil 353 that is provided inside the sound body 351 and disposed on the suspension 352, and terminals 354a and 354b that are connected to the suspension 352 and at least partially exposed to the outside of the sound body 351.

A bottom surface of the sound body 351 may be supported by the suspension 352, and a side surface of the sound body 351 may be supported by the inner wall 323. One surface of the sound body 351 may face the porous sheet 330. A surface of the sound body 351 facing the −z direction may be exposed to the outside through a main hole (not shown) formed to penetrate the main body 320, and a surface of the sound body 351 facing the +z direction may face the porous sheet 330.

The sound body 351 may include a surface 351a facing the porous sheet 330, and a body groove 351b recessed from the surface 351a. A plurality of body grooves 351b, for example, four body grooves 351b, may be formed. Each of the body grooves 351b may be formed, for example, in a corner portion of the surface 351a. It is noted that a number of body grooves 351b and positions of the body grooves 351b are not limited thereto.

The suspension 352 may absorb an impact to prevent an excessive impact from being applied to the voice coil 353. The suspension 352 may be electrically connected to the terminals 354a and 354b and the voice coil 353 to transmit information received through the terminals 354a and 354b to the voice coil 353. The suspension 352 may be connected to the base plate 321 by an adhesive layer 381 provided on one surface of the base plate 321.

The voice coil 353 may vibrate a diaphragm (not shown) based on information received through the terminals 354a and 354b and the suspension 352. The voice coil 353 may convert mechanical vibration and electrical vibration.

The terminals 354a and 354b may receive an electric signal from the outside and transmit the electric signal to the voice coil 353. At least a portion of the terminal 354a, 354b may be exposed to the outside of the sound body 351. Terminals 354a and 354b may be connected to the PCB 360. The terminals 354a and 354b may include a first terminal 354a and a second terminal 354b provided at positions spaced apart from each other. The first terminal 354a and the second terminal 354b may each be disposed in the body groove 351b. A depth at which the body groove 351b is recessed from the surface 351a may be greater than a thickness of each of the first terminal 354a and the second terminal 354b. The first terminal 354a and the second terminal 354b may be disposed below the surface 351a. For example, the first terminal 354a and the second terminal 354b may not protrude to the outside of the sound body 351.

The first terminal 354a may include a terminal base 3541a connected to the suspension 352, a terminal extension 3542a extending from the terminal base 3541a, and a terminal head 3543a that extends from the terminal extension 3542a and that is provided in parallel with the terminal base 3541a. A portion of the terminal head 3543a may be exposed to the outside. The second terminal 354b may have the same shape as that of the first terminal 354a.

The PCB 360 may be electrically connected to the sound generator 350. The PCB 360 may electrically connect an external electronic device (not shown) and the sound generator 350. The PCB 360 may be a flexible printed circuit board. The PCB 360 may include contact parts 361a and 361b connected to the terminals 354a and 354b, and extension parts 362a and 362b extending from the contact parts 361a and 361b to the outside of the main body 320.

The contact parts 361a and 361b may be physically and electrically connected to the terminals 354a and 354b, using, for example, soldering and/or welding. The contact parts 361a and 361b may include a first contact part 361a connected to the first terminal 354a, and a second contact part 361b connected to the second terminal 354b. The depth at which the body groove 351b is recessed from the surface 351a may be greater than a sum of a thicknesses of the first terminal 354a and a thickness of the first contact part 361a. It is noted that the depth at which the body groove 351b is recessed from the surface 351a may be less than the sum of the thicknesses of the first terminal 354a and the thickness of the first contact part 361a.

The extension parts 362a and 362b may include a connection part 362a to connect the first contact part 361a and the second contact part 361b, and a connection part 362b extending from the connection part 362a toward the outside of the main body 320. The connection part 362b may pass through the outer wall 322 through a wall groove 322a. The wall groove 322a may be recessed from one surface of the outer wall 322.

The non-conductive part 370 may isolate the porous sheet 330 from the PCB 360. The non-conductive part 370 may include an insulating material. The non-conductive part 370 may be provided between the PCB 360 and the porous sheet 330 to separate the PCB 360 and the porous sheet 330. The non-conductive part 370 may be applied onto the contact parts 361a and 361b. The non-conductive part 370 may be disposed on the contact parts 361a and 361b and may attach the porous sheet 330 and the contact parts 361a and 361b. For example, the non-conductive part 370 may be an insulating adhesive, for example, an insulating glue. The non-conductive part 370 may include a first non-conductive part 370a disposed on the first contact part 361a, and a second non-conductive part 370b disposed on the second contact part 361b.

For example, the non-conductive part 370 may be formed to protrude in the +z direction from the surface 351a of the sound body 351 facing the porous sheet 330. The non-conductive part 370 may isolate the porous sheet 330 from the sound body 351. Since the non-conductive part 370 is thinner than that shown in the drawings, the non-conductive part 370 may block the porous sheet 330 from being in direct contact with the contact parts 361a and 361b of the PCB 360 even though the non-conductive part 370 does not protrude from the surface 351a in the +z direction.

A first distance D1 from the porous sheet 330 to the terminal 354a, 354b may be greater than a second distance D2 from the porous sheet 330 to the sound body 351. Since the first distance D1 is greater than the second distance D2, the porous sheet 330 may be spaced apart from the terminals 354a and 354b, instead of directly contacting the terminals 354a and 354b, even though the non-conductive parts 370a and 370b and/or the contact parts 361a and 361b of the PCB 360 are separated from the terminals 354a and 354b. For example, when the non-conductive parts 370a and 370b are separated from the terminals 354a and 354b, the porous sheet 330 may be seated on the surface 351a and may be spaced apart from the body groove 351b.

The porous sheet 330 may enhance a sound quality of the speaker 310 by reducing an amount of air in the inner space S of the speaker 310 using a scheme of adsorbing air. Since the porous sheet 330 has a shape of a sheet corresponding to the inner space S of the speaker 310, a size of the porous sheet 330 may be easily adjusted according to a user's need. Since an edge portion of the porous sheet 330 is supported by the main body 320 and/or the cover 340, an unnecessary movement of the porous sheet 330 may be restricted.

The porous sheet 330 may include a material including activated carbon. Since the activated carbon is included in the porous sheet 330, the porous sheet 330 may have electrical conduction characteristics. The non-conductive part 370 may be disposed between the porous sheet 330 and the PCB 360 to block an electrical conduction between the porous sheet 330 and the PCB 360. Since the non-conductive part 370 has a shape of a thin layer, the non-conductive part 370 may occupy a small area in the inner space S of the speaker 310. The porous sheet 330 and the non-conductive part 370 may be compactly disposed in the inner space S of the speaker 310.

Figure 4A:
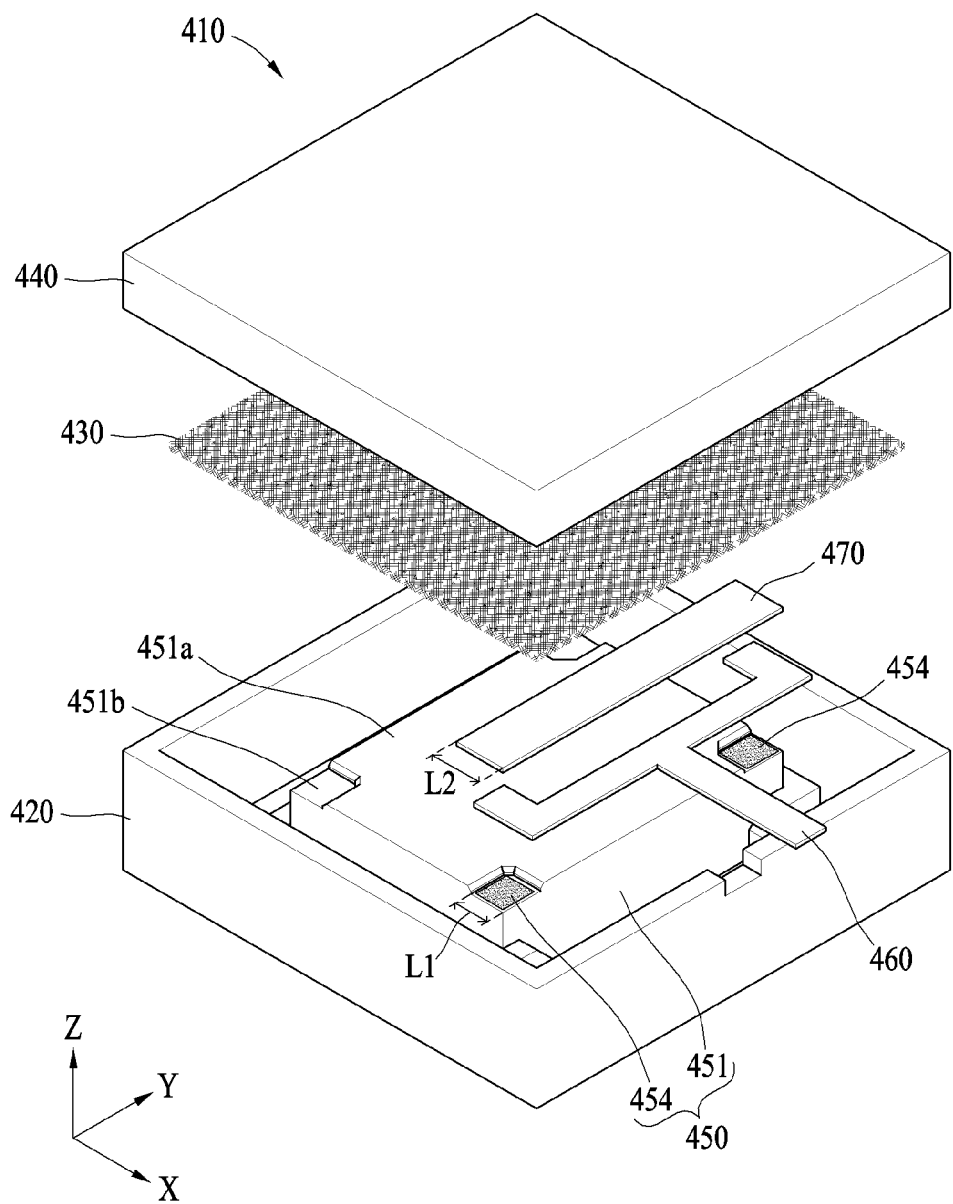
FIG. 4A is an exploded perspective view of a speaker including a porous sheet according to an embodiment of the disclosure.

FIG. 4A is an exploded perspective view of a speaker including a porous sheet according to an embodiment of the disclosure.

Figure 4B:
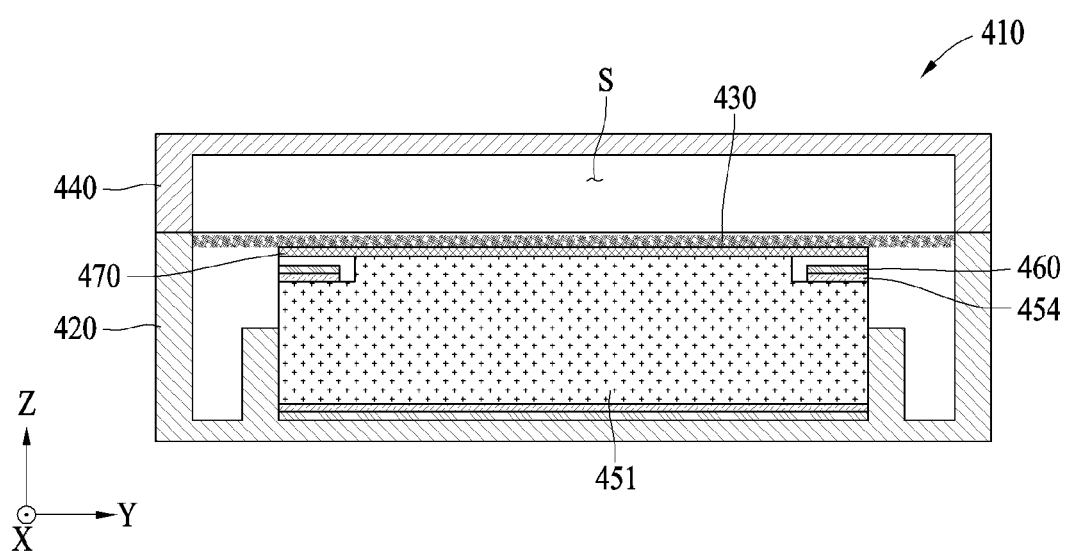
FIG. 4B is a cross-sectional view of a speaker including a porous sheet according to an embodiment of the disclosure.

FIG. 4B is a cross-sectional view of a speaker including a porous sheet according to an embodiment of the disclosure.

Referring to FIGS. 4A and 4B, in an embodiment, an electronic device (e.g., the electronic device 101 of FIG. 1, and the electronic device 200 of FIG. 2A) may include a sound output module (e.g., the sound output module 155 of FIG. 1) including a speaker 410.

The speaker 410 may include a main body 420, a porous sheet 430 inserted into the main body 420, a cover 440 connected to the main body 420 to cover the porous sheet 430, a sound generator 450 disposed inside the main body 420, a PCB 460 electrically connected to the sound generator 450, and a non-conductive part 470 provided between the PCB 460 and the porous sheet 430.

The sound generator 450 may include a sound body 451 constituting an exterior, and a terminal 454 that is at least partially exposed to the outside of the sound body 451. The sound body 451 may include a surface 451a facing the porous sheet 430, and a body groove 451b recessed from the surface 451a.

The non-conductive part 470 may be disposed on the sound body 451, and at least a portion of the non-conductive part 470 may cover a contact part of the PCB 460. For example, a first length L1 that is a length of the body groove 451b in the x-axis direction may be less than a second length L2 that is a length of the non-conductive part 470 in the x-axis direction. Since the second length L2 is greater than the first length L1, the non-conductive part 470 may not be deformed toward the body groove 451b and may remain seated on the sound body 451.

The non-conductive part 470 may be a sheet formed of a flexible material. The non-conductive part 470 may separate the porous sheet 430 from the contact part of the PCB 460, thereby blocking an electrical connection between the porous sheet 430 and the PCB 460. The non-conductive part 470 may have an elongated shape. One end portion of the non-conductive part 470 may cover a terminal 454 disposed on a −y side among two terminals 454, and another end portion of the non-conductive part 470 may cover a terminal 454 disposed on a +y side among the two terminals 454.

After the PCB 460 is disposed on the terminal 454, the non-conductive part 470 may be disposed on the surface 451a of the sound body 451. After the non-conductive part 470 is disposed on the surface 451a of the sound body 451, the porous sheet 430 may be inserted into the main body 420. At least a portion of the porous sheet 430 may be in contact with the non-conductive part 470, and the remaining portion of the porous sheet 430 that does not contact the non-conductive part 470 may be spaced apart from the sound body 451. It is noted that the porous sheet 430 may also be in contact with the sound body 451.

The porous sheet 430 may enhance a sound quality of the speaker 410 by reducing an amount of air in an inner space S of the speaker 410 using a scheme of adsorbing air. Since the porous sheet 430 has a shape of a sheet corresponding to the inner space S, a size of the porous sheet 430 may be easily adjusted.

Figure 5A:
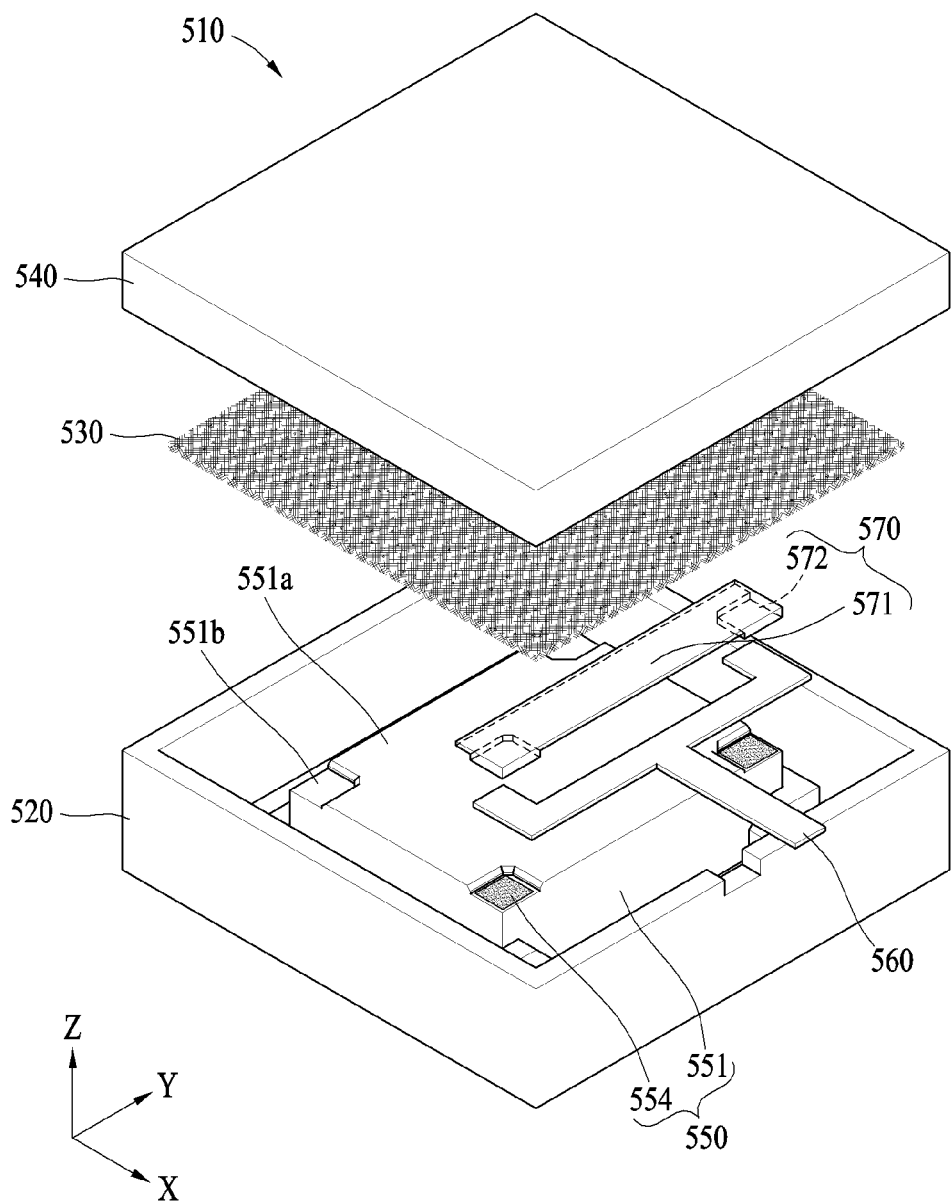
FIG. 5A is an exploded perspective view of a speaker including a porous sheet according to an embodiment of the disclosure.

FIG. 5A is an exploded perspective view of a speaker including a porous sheet according to an embodiment of the disclosure.

Figure 5B:
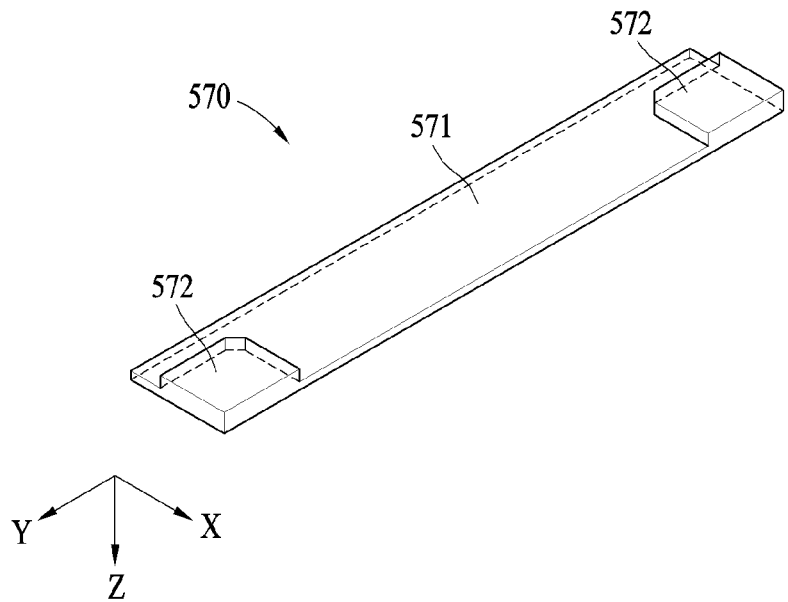
FIG. 5B is a perspective view of a non-conductive part according to an embodiment of the disclosure.

FIG. 5B is a perspective view of a non-conductive part according to an embodiment of the disclosure.

Figure 5C:
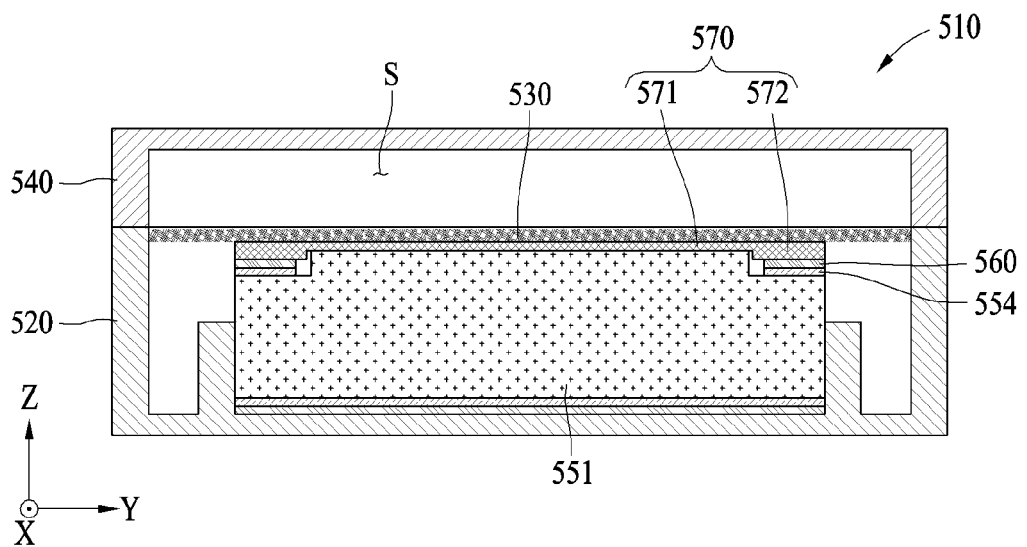
FIG. 5C is a cross-sectional view of a speaker including a porous sheet according to an embodiment of the disclosure.

FIG. 5C is a cross-sectional view of a speaker including a porous sheet according to an embodiment of the disclosure.

Referring to FIGS. 5A, 5B, and 5C, in an embodiment, a speaker 510 may include a main body 520, a porous sheet 530 inserted into the main body 520, a cover 540 connected to the main body 520 to cover the porous sheet 530, a sound generator 550 disposed inside the main body 520, a PCB 560 electrically connected to the sound generator 550, and a non-conductive part 570 disposed between the PCB 560 and the porous sheet 530.

The sound generator 550 may include a sound body 551 constituting an exterior, and a terminal 554 that is at least partially exposed to the outside of the sound body 551. The sound body 551 may have a surface 551a facing the porous sheet 530, and a body groove 551b recessed from the surface 551a.

The non-conductive part 570 may be disposed on the sound body 551, and at least a portion of the non-conductive part 570 may cover a contact part of the PCB 560.

The non-conductive part 570 may have a shape of a plate formed of a rigid material. The non-conductive part 570 may separate the porous sheet 530 from the contact part of the PCB 560, thereby blocking an electrical connection between the porous sheet 530 and the PCB 560.

The non-conductive part 570 may include a non-conductive body 571 that is disposed on the sound body 551, and a protrusion 572 that is formed to protrude from the non-conductive body 571 toward the contact part of the PCB 560. One end portion of the non-conductive part 570 may cover a terminal 554 disposed on a −y side among two terminals 554, and another end portion of the non-conductive part 570 may cover a terminal 554 disposed on a +y side among the two terminals 554.

The non-conductive body 571 may have an elongated shape. A length of the non-conductive body 571 in the x-axis direction may be greater than a length of the body groove 551b in the x-axis direction.

A number of protrusions 572 may correspond to a number of terminals 554. For example, two protrusions 572 may be provided. One of the two protrusions 572 may protrude from a −y-direction end portion of the non-conductive body 571 in the −z direction, and the other protrusion 572 may protrude from a +y-direction end portion of the non-conductive body 571 in the −z direction. For example, the protrusion 572 may directly contact the contact part of the PCB 560. A surface of the contact part of the PCB 560 facing the −z direction may contact the terminal 554, and a surface of the contact part facing the +z direction may contact the protrusion 572 of the non-conductive part 570.

After the PCB 560 is disposed on the terminal 554, the non-conductive part 570 may be disposed on the surface 551a of the sound body 551. After the non-conductive part 570 is disposed on the surface 551a of the sound body 551, the porous sheet 530 may be inserted into the main body 520. At least a portion of the porous sheet 530 may be in contact with the non-conductive part 570, and the remaining portion of the porous sheet 530 that does not contact the non-conductive part 570 may be spaced apart from the sound body 551. It is noted that the porous sheet 530 may also be in contact with the sound body 551.

In an area in which the PCB 560 and the terminal 554 overlap in the z-axis direction, a surface of the porous sheet 530 facing the −z direction may contact the PCB 560, and a surface of the porous sheet 530 facing the +z direction may contact the porous sheet 530, thereby reducing or preventing shaking of the porous sheet 530 between the PCB 560 and the porous sheet 530.

The porous sheet 530 may enhance a sound quality of the speaker 510 by reducing an amount of air in an inner space S of the speaker 510 using a scheme of adsorbing air. Since the porous sheet 530 has a shape of a sheet corresponding to the inner space S, a size of the porous sheet 530 may be easily adjusted according to a user's need.

Figure 6A:
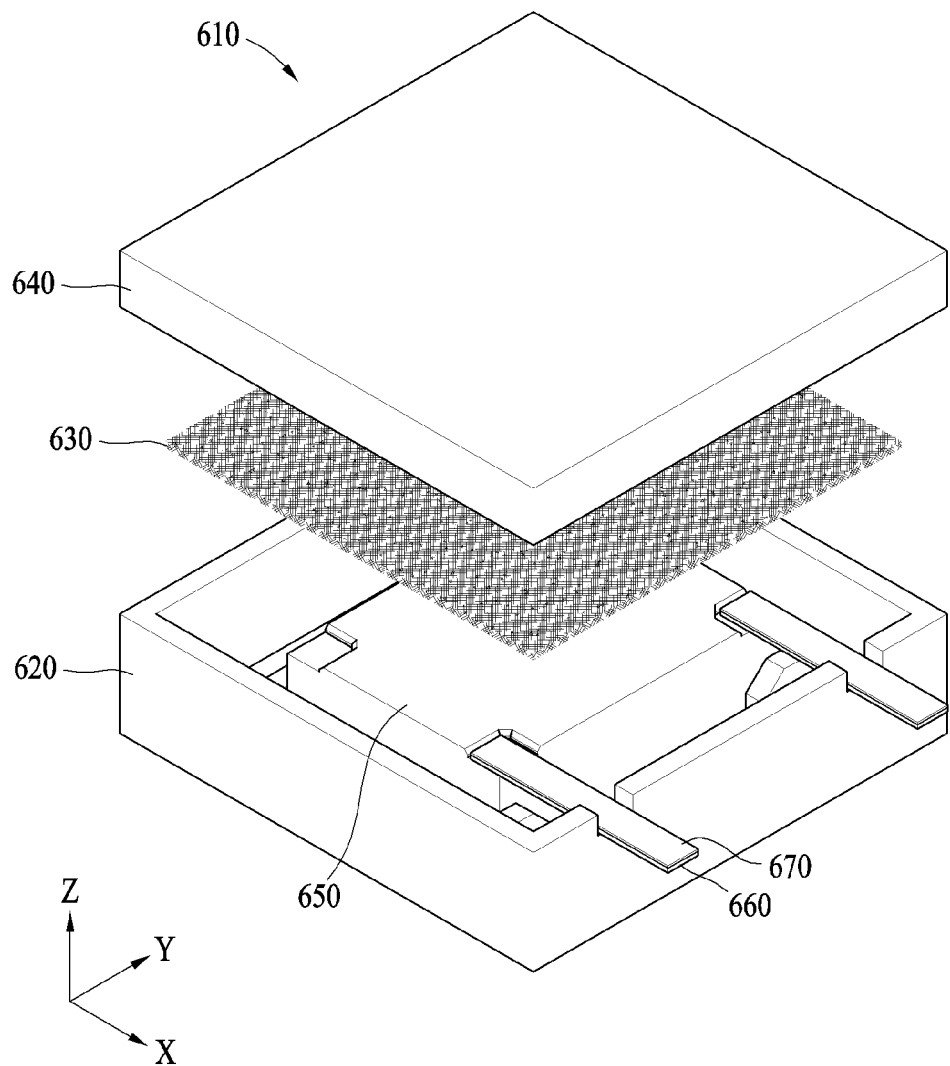
FIG. 6A is an exploded perspective view of a speaker including a porous sheet according to an embodiment of the disclosure.

FIG. 6A is an exploded perspective view of a speaker including a porous sheet according to an embodiment of the disclosure.

Figure 6B:
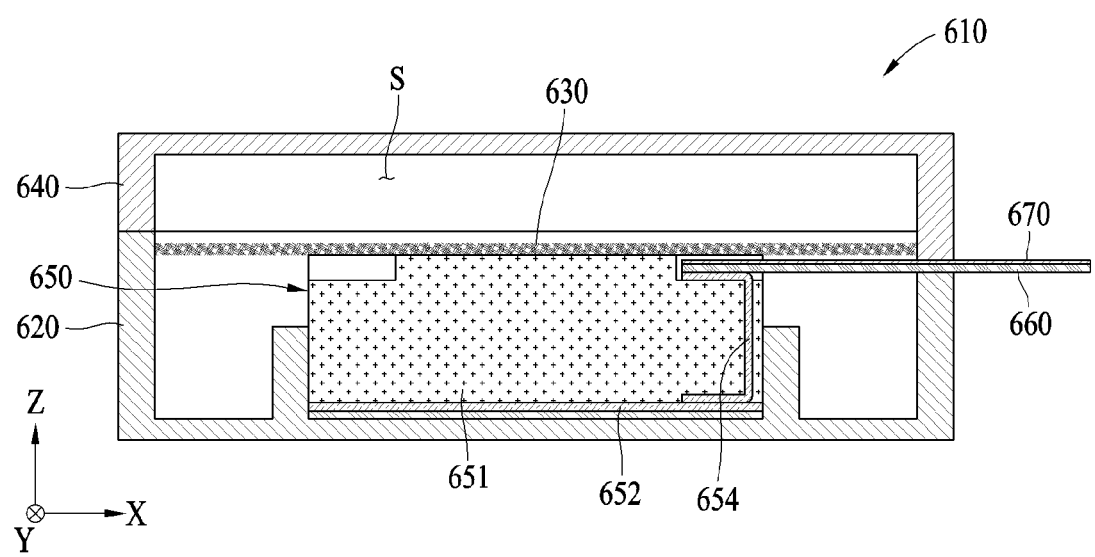
FIG. 6B is a cross-sectional view of a speaker including a porous sheet according to an embodiment of the disclosure.

FIG. 6B is a cross-sectional view of a speaker including a porous sheet according to an embodiment of the disclosure.

Referring to FIGS. 6A and 6B, in an embodiment, a speaker 610 may include a main body 620, a porous sheet 630 inserted into the main body 620, a cover 640 connected to the main body 620 to cover the porous sheet 630, a sound generator 650 disposed inside the main body 620, a PCB 660 electrically connected to the sound generator 650, and a non-conductive part 670 disposed between the PCB 660 and the porous sheet 630. The sound generator 650 may include a sound body 651 constituting an exterior, a suspension 652 configured to support the sound body 651, and a terminal 654 that is at least partially exposed to the outside of the sound body 651.

The porous sheet 630 may enhance a sound quality of the speaker 610 by reducing an amount of air in an inner space S of the speaker 610 using a scheme of adsorbing air. Since the porous sheet 630 has a shape of a sheet corresponding to the inner space S, a size of the porous sheet 630 may be easily adjusted according to a user's need.

The non-conductive part 670 may be a coating layer applied onto one surface of the printed circuit board 660. The non-conductive part 670 may separate the porous sheet 630 from the PCB 660, thereby blocking an electrical connection between the porous sheet 630 and the PCB 660. The non-conductive part 670, together with the PCB 660, may extend to the outside of the main body 620 and the cover 640.

Figure 7A:
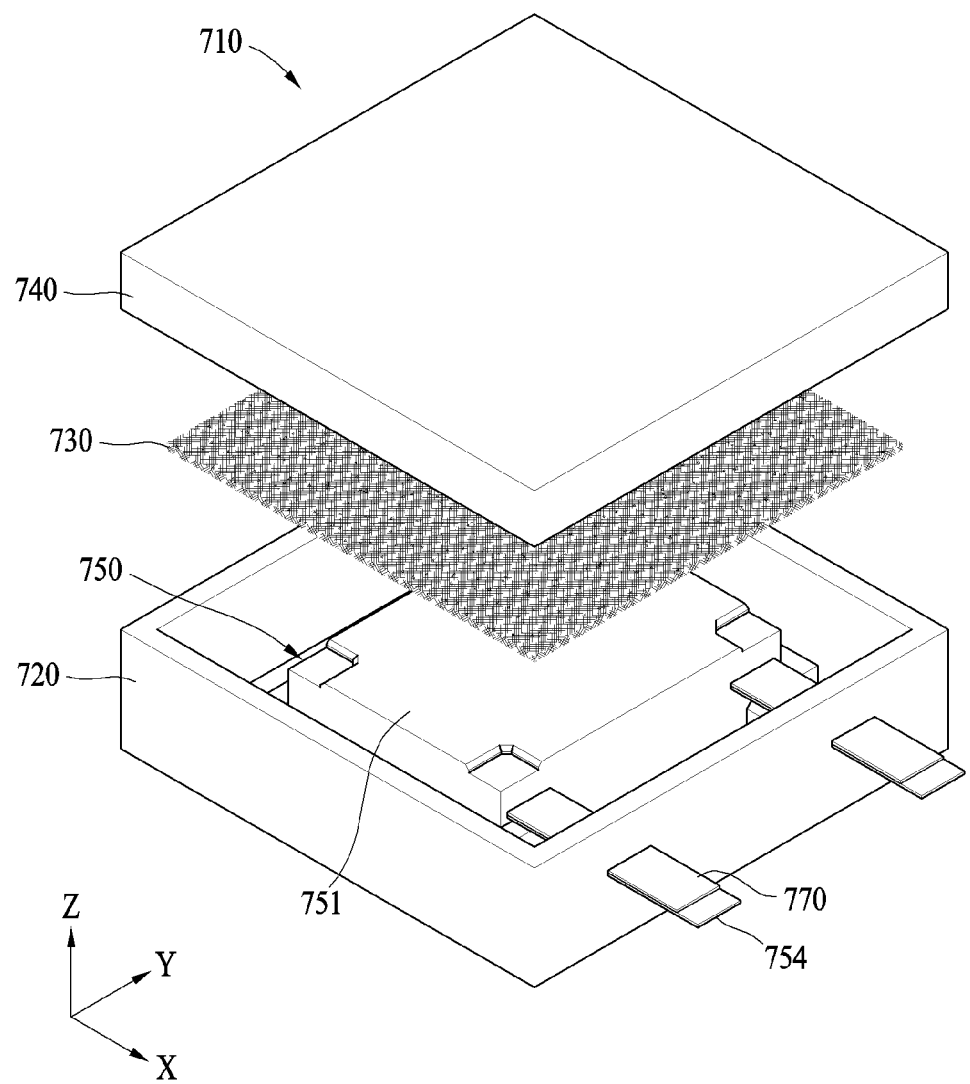
FIG. 7A is an exploded perspective view of a speaker including a porous sheet according to an embodiment of the disclosure.

FIG. 7A is an exploded perspective view of a speaker including a porous sheet according to an embodiment of the disclosure.

Figure 7B:
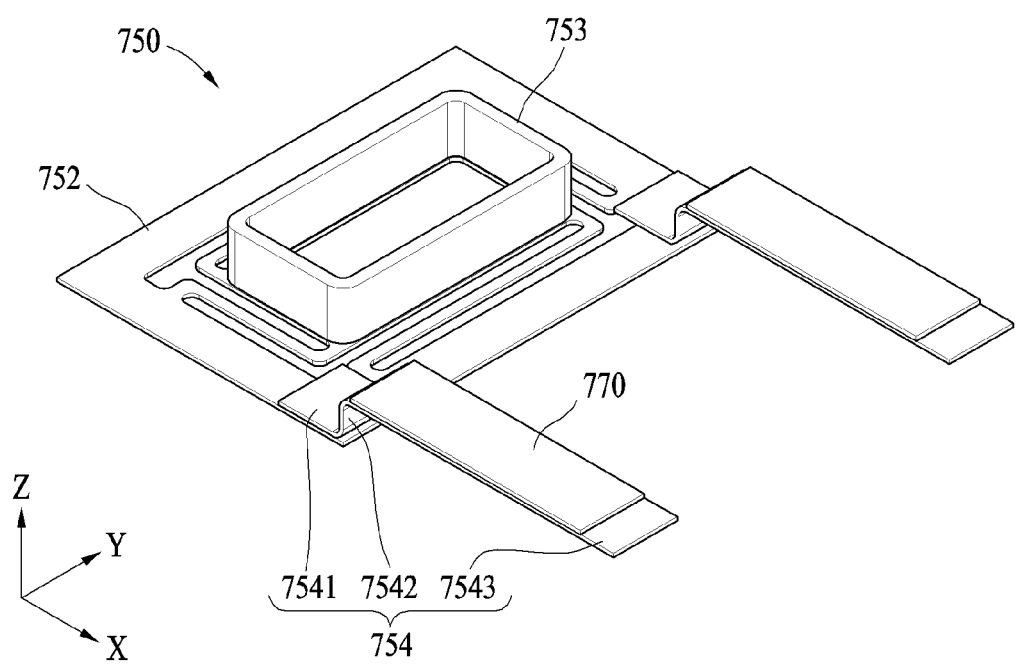
FIG. 7B is a perspective view of a sound generator with a sound body omitted according to an embodiment of the disclosure.

FIG. 7B is a perspective view of a sound generator with a sound body omitted according to an embodiment of the disclosure.

Referring to FIGS. 7A and 7B, in an embodiment, a speaker 710 may include a main body 720, a porous sheet 730 inserted into the main body 720, a cover 740 connected to the main body 720 to cover the porous sheet 730, a sound generator 750 disposed inside the main body 720, a PCB 760 electrically connected to the sound generator 750, and a non-conductive part 770 disposed between the PCB 760 and the porous sheet 730.

The sound generator 750 may include a sound body 751 constituting an exterior, a suspension 752 configured to support the sound body 751, a voice coil 753 disposed on the suspension 752, and a terminal 754 that is at least partially exposed to the outside of the sound body 751.

The terminal 754 may not be disposed in a space between the porous sheet 730 and a surface of the sound generator 750 facing the porous sheet 730. For example, the terminal 754 may be provided at an opposite side of the porous sheet 730 with respect to the surface of the sound generator 750 facing the porous sheet 730.

The terminal 754 may include a terminal base 7541 connected to the suspension 752, a terminal extension 7542 extending from the terminal base 7541, and a terminal head 7543 that extends from the terminal extension 7542 and that is provided in parallel with the terminal base 7541. The terminal head 7543 may not overlap the terminal base 7541 based on a direction (e.g., the z-axis direction) in which the terminal extension 7542 extends. At least a portion of the terminal head 7543 may be exposed to the outside of the sound body 751.

The non-conductive part 770 may be connected to the terminal head 7543. The non-conductive part 770 may separate the terminal head 7543 and the porous sheet 730 to prevent the terminal head 7543 and the porous sheet 730 from contacting each other.

Figure 8:
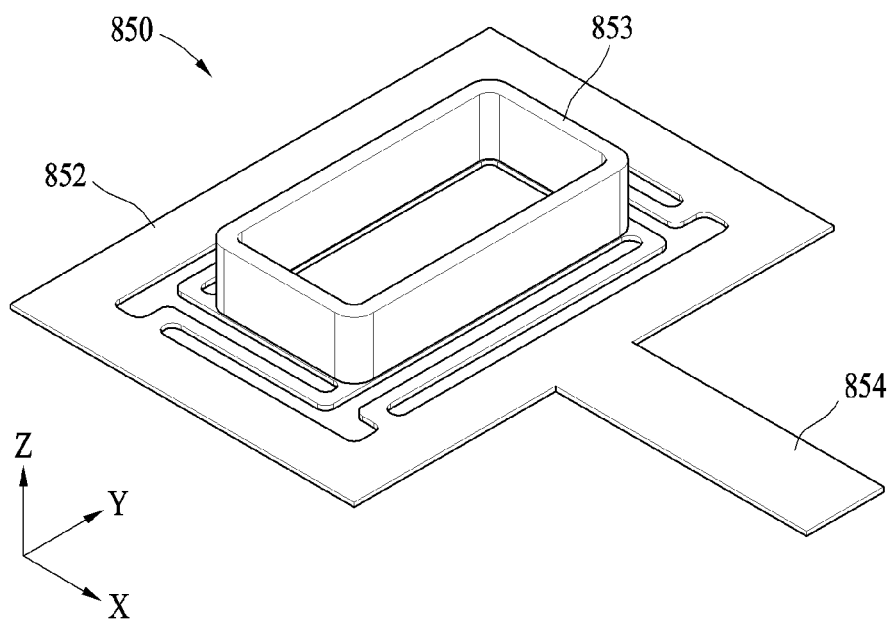
FIG. 8 is a perspective view of a sound generator with a sound body omitted according to an embodiment of the disclosure.

FIG. 8 is a perspective view of a sound generator with a sound body omitted according to an embodiment of the disclosure.

Referring to FIG. 8, in an embodiment, a sound generator 850 may include a suspension 852, a voice coil 853 disposed on the suspension 852, and a terminal 854 extending from the suspension 852. The terminal 854 may be formed in a line with the suspension 852, instead of being provided at a position spaced apart from the suspension 852 in the z-axis direction. The terminal 854 may be provided at an opposite side of a porous sheet (e.g., the porous sheet 330 of FIG. 3A) with respect to a surface (e.g., the surface 351a of FIG. 3A) of the sound body facing the porous sheet.

Figure 9A:
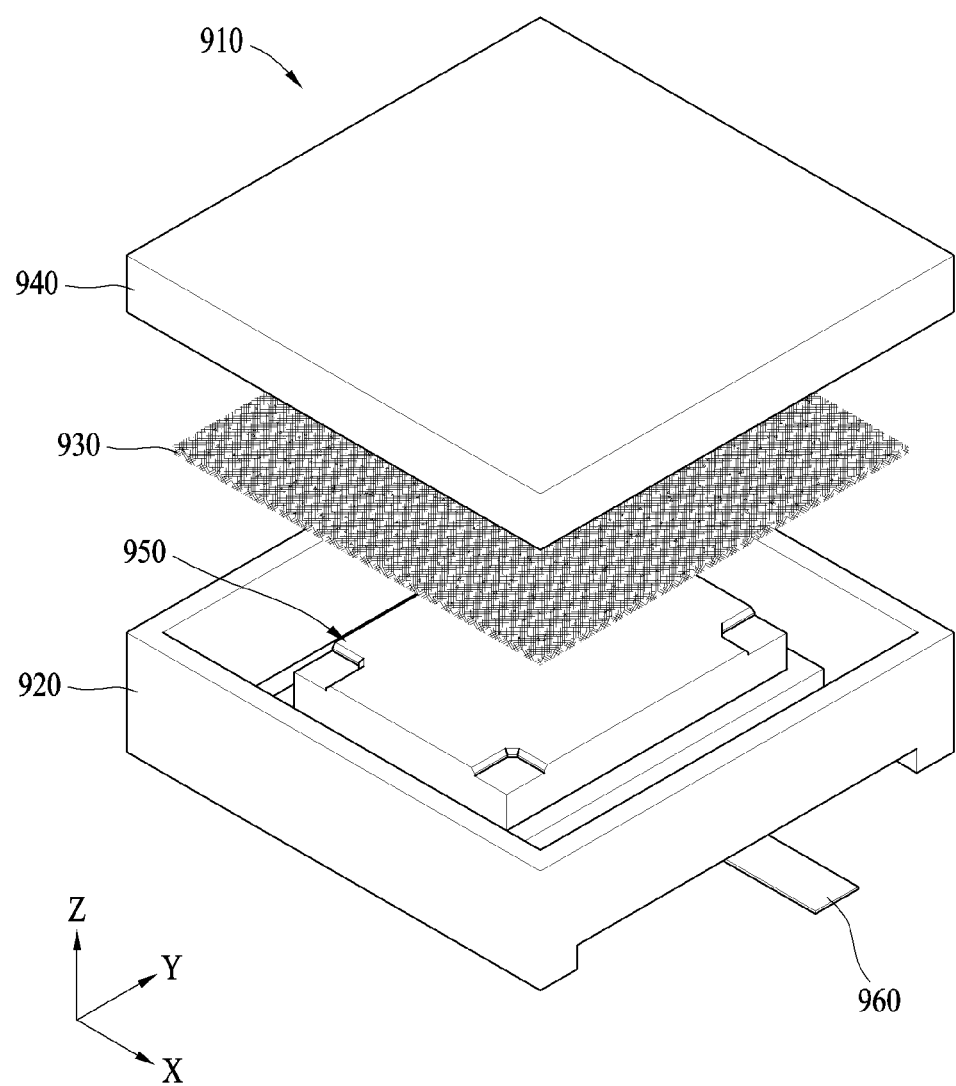
FIG. 9A is an exploded perspective view of a speaker including a porous sheet according to an embodiment of the disclosure.

FIG. 9A is an exploded perspective view of a speaker including a porous sheet according to an embodiment of the disclosure.

Figure 9B:
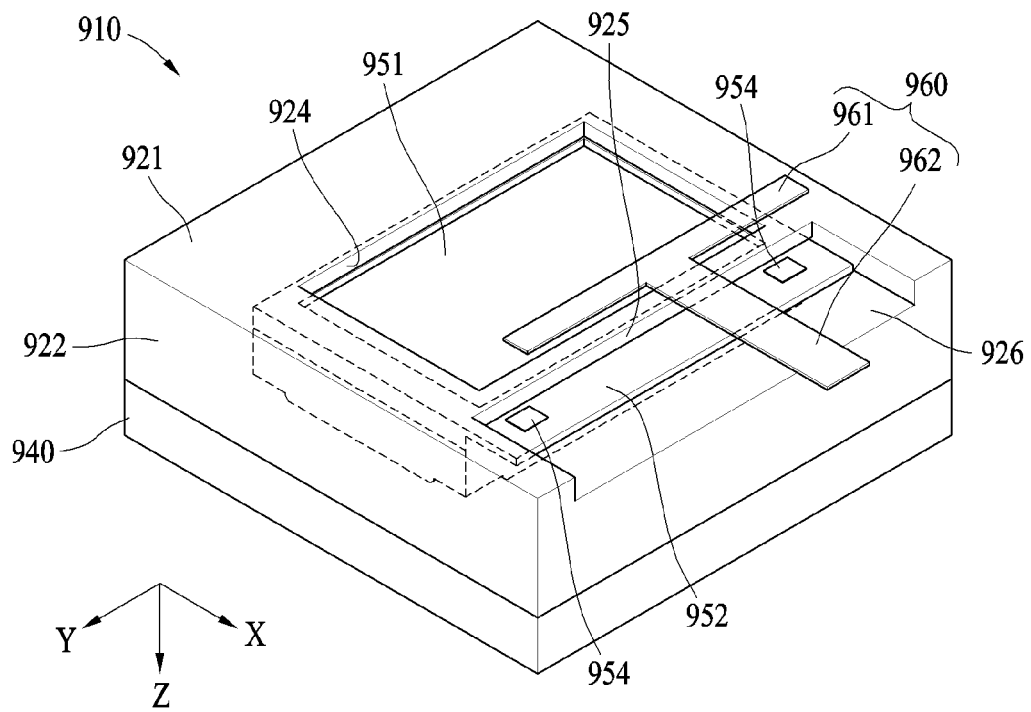
FIG. 9B is an exploded perspective view of a speaker including a porous sheet at a different angle from that of FIG. 9A according to an embodiment of the disclosure.

FIG. 9B is an exploded perspective view of a speaker including a porous sheet according to an embodiment of the disclosure, at a different angle from that of FIG. 9A.

Figure 9C:
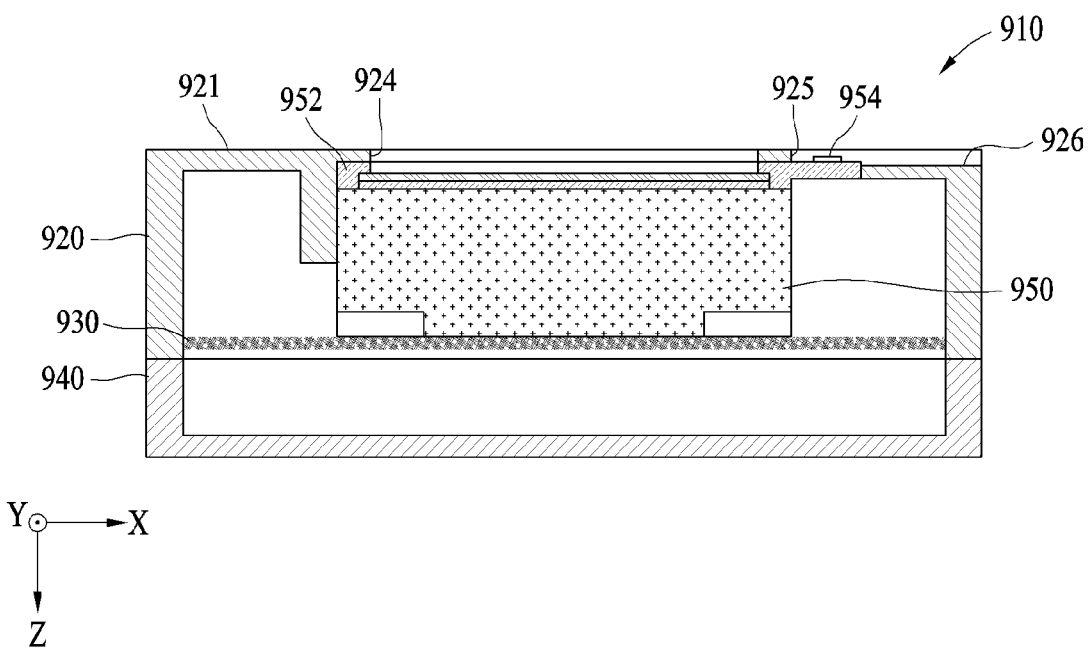
FIG. 9C is a cross-sectional view of a speaker including a porous sheet according to an embodiment of the disclosure.

FIG. 9C is a cross-sectional view of a speaker including a porous sheet according to an embodiment of the disclosure.

FIG. 9A illustrates a rear area of the speaker according to an embodiment, and FIG. 9B illustrates a front area of the speaker according to an embodiment.

Referring to FIGS. 9A, 9B, and 9C, in an embodiment, a speaker 910 may include a main body 920, a porous sheet 930 inserted into the main body 920, a cover 940 connected to the main body 920 to cover the porous sheet 930, a sound generator 950 disposed inside the main body 920, and a PCB 960 electrically connected to the sound generator 950.

The sound generator 950 may include a sound body 951 constituting an exterior, a suspension 952 configured to support the sound body 951, and a terminal 954 disposed on one side of the suspension 952. The terminal 954 may be disposed on a surface of the suspension 952 facing the −z direction. The terminal 954 may be disposed at an opposite side of the porous sheet 930 with respect to the suspension 952.

The main body 920 may include a base plate 921, an outer wall 922 extending from the base plate 921, a main hole 924 formed to penetrate the base plate 921 to expose at least a portion of the sound body 951 to the outside, a terminal hole 925 formed to penetrate the base plate 921 to expose the terminal 954 to the outside, and a board receiving groove 926 recessed from the base plate 921 to communicate with the terminal hole 925. The board receiving groove 926 may receive and support the PCB 960. Although the main hole 924 and the terminal hole 925 are illustrated as being separated from each other, it is noted that the main hole 924 and the terminal hole 925 may also communicate with each other.

The porous sheet 930 may be disposed on the sound generator 950. The porous sheet 930 may enhance a sound quality of the speaker 910 by reducing an amount of air in an inner space of the speaker 910 using a scheme of adsorbing air.

The PCB 960 may include a contact part 961 connected to the terminal 954, and an extension part 962 extending from the contact part 961. Two terminals 954 may be provided to be spaced apart from each other in the y-axis direction. The contact part 961 may have an elongated shape in the y-axis direction. One end of the contact part 961 may contact one terminal and another end of the contact part 961 may contact the other terminal.

The terminal 954 and the PCB 960 may be provided on a front side based on the suspension 952, and the porous sheet 930 may be provided on a rear side based on the suspension 952, and thus the porous sheet 930 may be spatially separated from the terminal 954 and the PCB 960.

Figure 10A:
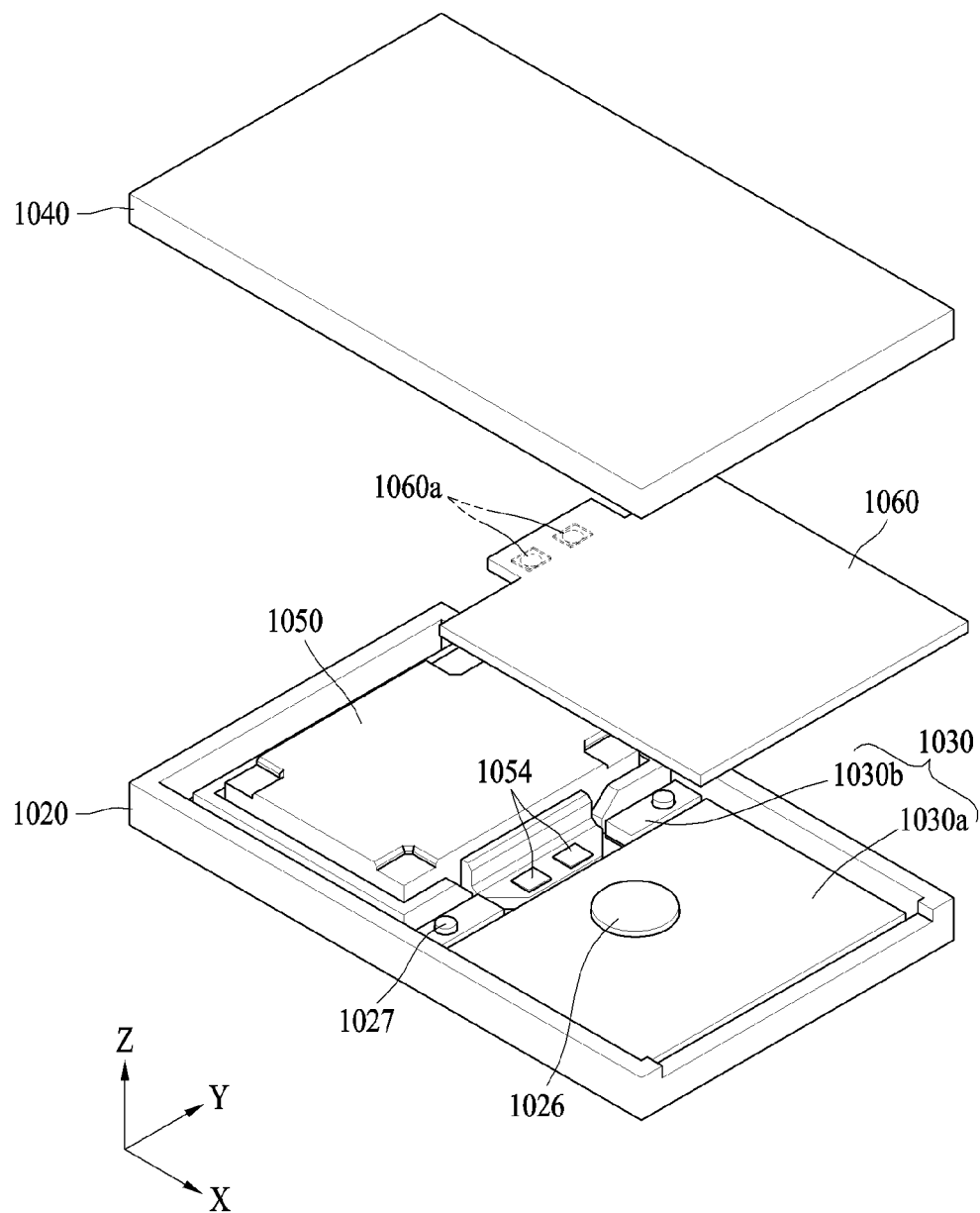
FIG. 10A is an exploded perspective view of a speaker including a porous sheet according to an embodiment of the disclosure.

FIG. 10A is an exploded perspective view of a speaker including a porous sheet according to an embodiment of the disclosure.

Figure 10B:
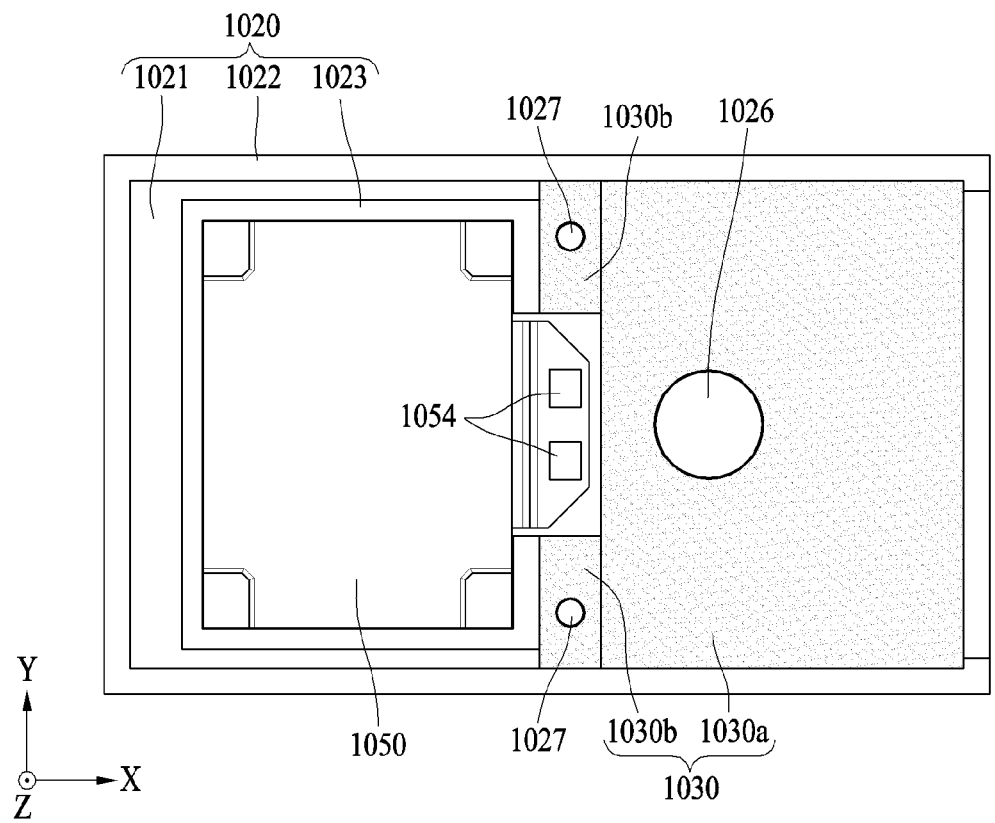
FIG. 10B is a plan view of a speaker including a porous sheet with a cover omitted according to an embodiment of the disclosure.

FIG. 10B is a plan view of a speaker including a porous sheet with a cover omitted according to an embodiment of the disclosure.

Figure 10C:
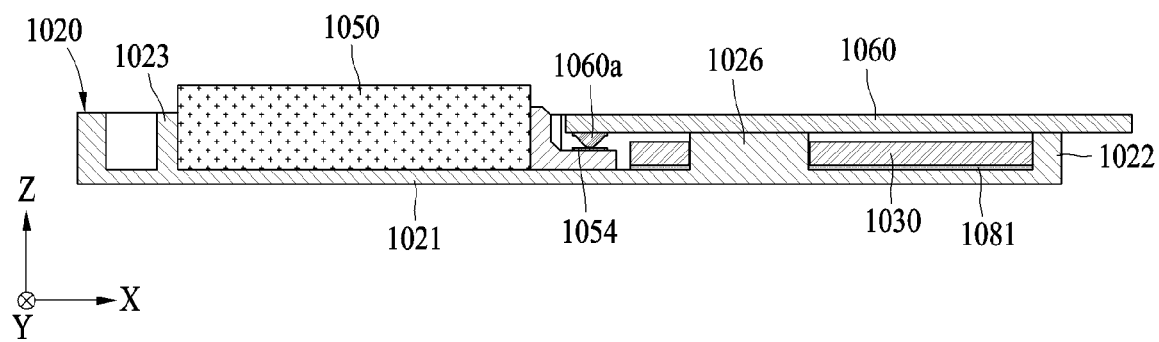
FIG. 10C is a cross-sectional view of a speaker including a porous sheet with a cover omitted according to an embodiment of the disclosure.

FIG. 10C is a cross-sectional view of a speaker including a porous sheet with a cover omitted according to an embodiment of the disclosure.

Referring to FIGS. 10A, 10B, and 10C, in an embodiment, a speaker may include a main body 1020, a porous sheet 1030 inserted into the main body 1020, a cover 1040 connected to the main body 1020 to cover the porous sheet 1030, a sound generator 1050 disposed inside the main body 1020, and a PCB 1060 electrically connected to the sound generator 1050. The PCB 1060 may include a terminal 1060a that contacts a terminal 1054.

The main body 1020 may include a base plate 1021, an outer wall 1022 formed to protrude from the base plate 1021, an inner wall 1023 that is formed to protrude from the base plate 1021 and that is disposed on an inside of the outer wall 1022, and fixing rods 1026 and 1027 that is formed to protrude from the base plate 1021 and penetrate the porous sheet 1030.

The porous sheet 1030 may be provided at a position spaced apart from the terminal 1054 in a direction, for example, the x-axis direction or the y-axis direction, orthogonal to the z-axis direction that is a direction in which the porous sheet 1030 is inserted into the main body 1020. An adhesive layer 1081 for attaching the porous sheet 1030 and the base plate 1021 may be provided between the porous sheet 1030 and the base plate 1021.

A plurality of porous sheets 1030 may be provided. The plurality of porous sheets 1030 may include a main sheet 1030a having a relatively large size and at least one auxiliary sheet 1030b having a relatively small size.

A movement of the main sheet 1030a may be restricted by a first fixing rod 1026, the outer wall 1022 and the auxiliary sheet 1030b. A central portion of the main sheet 1030a may be supported by the first fixing rod 1026, and an edge portion thereof may be supported by the outer wall 1022 and the auxiliary sheet 1030b. The main sheet 1030a may be spaced apart from the terminal 1054 in the x-axis direction. For example, the main sheet 1030a may be spatially separated from the terminal 1054.

A movement of the auxiliary sheet 1030b may be restricted by the second fixing rod 1027, the outer wall 1022, the inner wall 1023, and the main sheet 1030a. A central portion of the auxiliary sheet 1030b may be supported by the second fixing rod 1027, and an edge portion of the auxiliary sheet 1030b may be supported by the outer wall 1022, the inner wall 1023, and the main sheet 1030a. The auxiliary sheet 1030b may be spaced apart from the terminal 1054 in the y-axis direction. In other words, the auxiliary sheet 1030b may be spatially separated from the terminal 1054. It is noted that the main sheet 1030a and the auxiliary sheet 1030b may be integrally formed.

The PCB 1060 may be seated on the second fixing rod 1027. The PCB 1060 may be spaced apart from the porous sheet 1030 in the z-axis direction.

Figure 11:
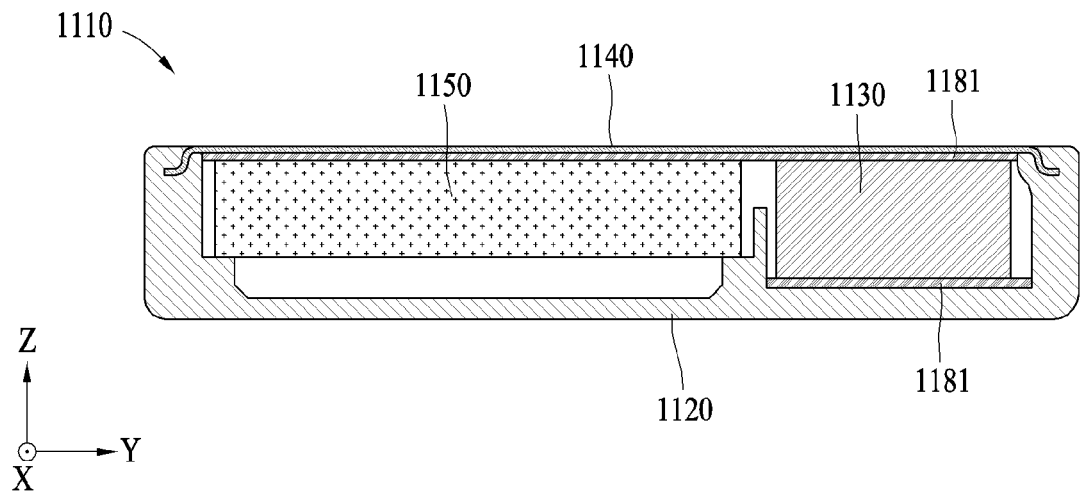
FIG. 11 is a cross-sectional view of a speaker including a porous sheet according to an embodiment of the disclosure.

FIG. 11 is a cross-sectional view of a speaker including a porous sheet according to an embodiment of the disclosure.

Referring to FIG. 11, a speaker 1110 may include a main body 1120, a porous sheet 1130 inserted into the main body 1120, a cover 1140 connected to the main body 1120, a sound generator 1150 disposed inside the main body 1120, and an adhesive layer 1181.

The porous sheet 1130 may be provided at a position spaced apart from the sound generator 1150 in a direction, for example, the y-axial direction, orthogonal to the z-axis direction that is a direction in which the porous sheet 1130 is inserted into the main body 1120. The porous sheet 1130 may have a shape of a sheet having a relatively large thickness in the z-axis direction.

The cover 1140 may cover the sound generator 1150 and the porous sheet 1130.

The adhesive layer 1181 may be provided between the main body 1120 and the porous sheet 1130 to fix the main body 1120 and the porous sheet 1130. The adhesive layer 1181 may be provided between the cover 1140 and the porous sheet 1130 to fix the cover 1140 and the porous sheet 1130. The adhesive layer 1181 may include an insulating material.

Figure 12:
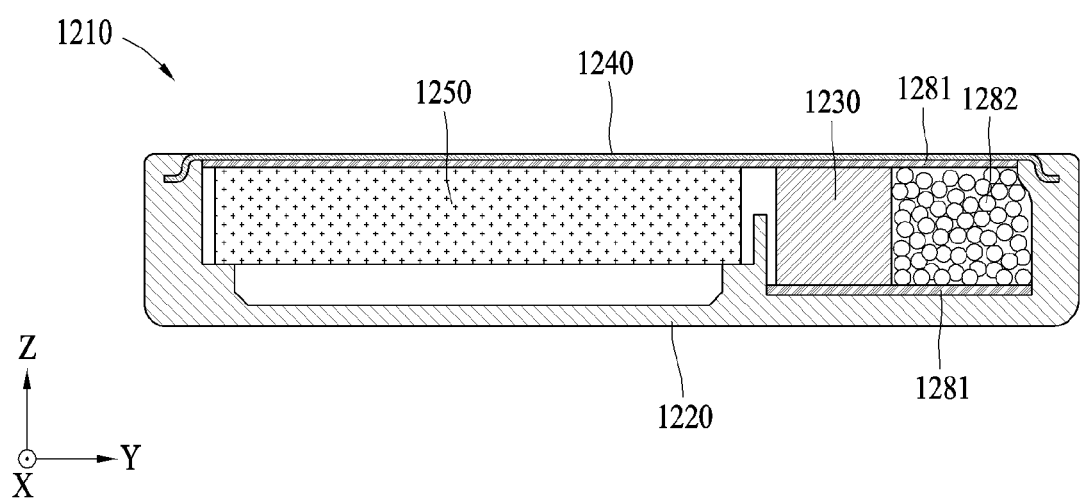
FIG. 12 is a cross-sectional view of a speaker including a porous sheet according to an embodiment of the disclosure.

FIG. 12 is a cross-sectional view of a speaker including a porous sheet according to an embodiment of the disclosure.

Referring to FIG. 12, a speaker 1210 may include a main body 1220, a porous sheet 1230 inserted into the main body 1220, a cover 1240 connected to the main body 1220, a sound generator 1250 disposed inside the main body 1220, an adhesive layer 1281, and a plurality of porous capsules 1282. The porous sheet 1230 may have a shape of a sheet having a relatively large thickness in the z-axis direction. For example, a thickness of the porous sheet 1230 in the z-axis direction may be greater than a length of the porous sheet 1230 in the y-axis direction.

The porous sheet 1230 may be provided at a position spaced apart from the sound generator 1250 in a direction, for example, the y-axial direction, orthogonal to the z-axis direction that is a direction in which the porous sheet 1230 is inserted into the main body 1220.

The cover 1240 may cover the sound generator 1250 and the porous sheet 1230.

The plurality of porous capsules 1282 may be provided in a closed space between the porous sheet 1230 and the main body 1220. Each of the plurality of porous capsules 1282 may have a plurality of micro-holes. The plurality of porous capsules 1282 may increase performance of the speaker 1210 by adsorbing air in an inner space of the speaker 1210. Since the plurality of porous capsules 1282 is disposed in a space surrounded by the porous sheet 1230 and the main body 1220, a degree of movement by vibration may be reduced. For example, the plurality of porous capsules 1282 may be fixed in the space surrounded by the porous sheet 1230 and the main body 1220. The plurality of porous capsules 1282 may have different shapes and sizes. A number and size of micro-holes of one of the plurality of porous capsules 1282 may be different from a number and size of micro-holes of another one of the plurality of porous capsules 1282.

Figure 13:
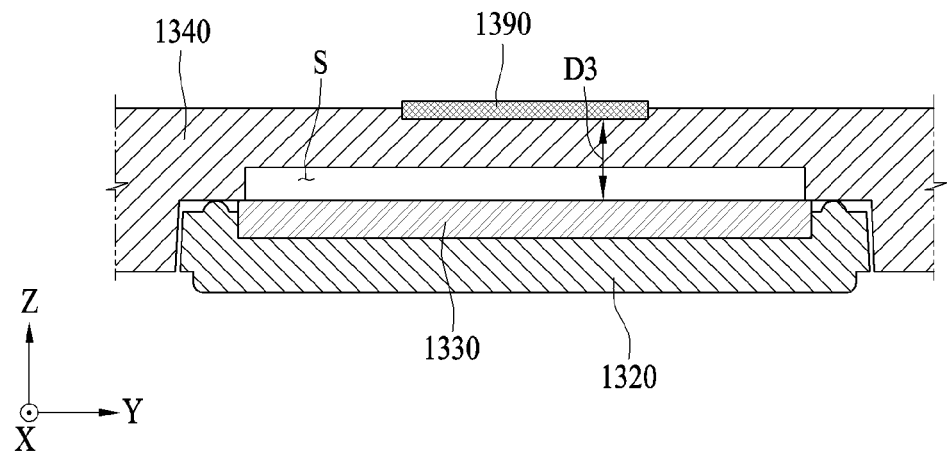
FIG. 13 is a cross-sectional view of a speaker including a porous sheet according to an embodiment of the disclosure.

FIG. 13 is a cross-sectional view of a speaker including a porous sheet according to an embodiment of the disclosure.

Referring to FIG. 13, the speaker may include a main body 1320, a porous sheet 1330, a cover 1340, and an antenna pattern 1390 (e.g., the antenna module 197 of FIG. 1) disposed on one surface of the cover 1340. The porous sheet 1330 may adsorb air in an inner space S of the speaker.

The porous sheet 1330 may be provided to be spaced apart from the antenna pattern 1390 by a predetermined distance in the z-axis direction. For example, a distance D3 by which the porous sheet 1330 is spaced apart from the antenna pattern 1390 in the z-axis direction may be greater than or equal to 0.5 mm.

Figure 14:
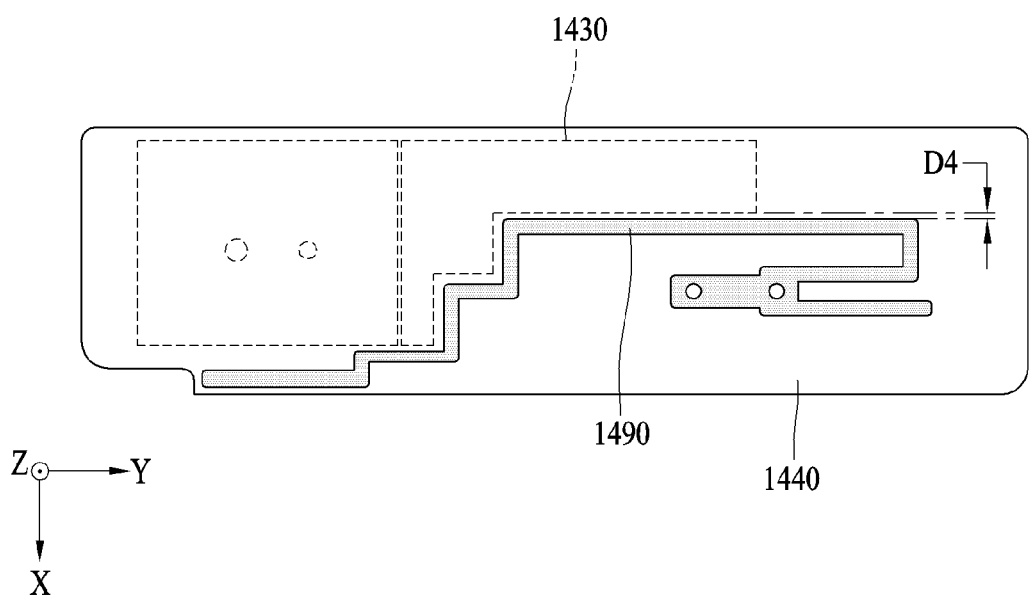
FIG. 14 is a plan view of a speaker including a porous sheet according to an embodiment of the disclosure.

FIG. 14 is a plan view of a speaker including a porous sheet according to an embodiment of the disclosure.

Referring to FIG. 14, the speaker may include a porous sheet 1430, a cover 1440, and an antenna pattern 1490 (e.g., the antenna module 197 of FIG. 1) disposed on one surface of the cover 1440.

The porous sheet 1430 may be provided to be spaced apart from the antenna pattern 1490 by a predetermined distance in the x-axis direction or the y-axis direction. For example, a distance D4 by which the porous sheet 1430 is spaced apart from the antenna pattern 1490 in the x-axis direction may be greater than or equal to 0.5 mm.

Figure 15A:
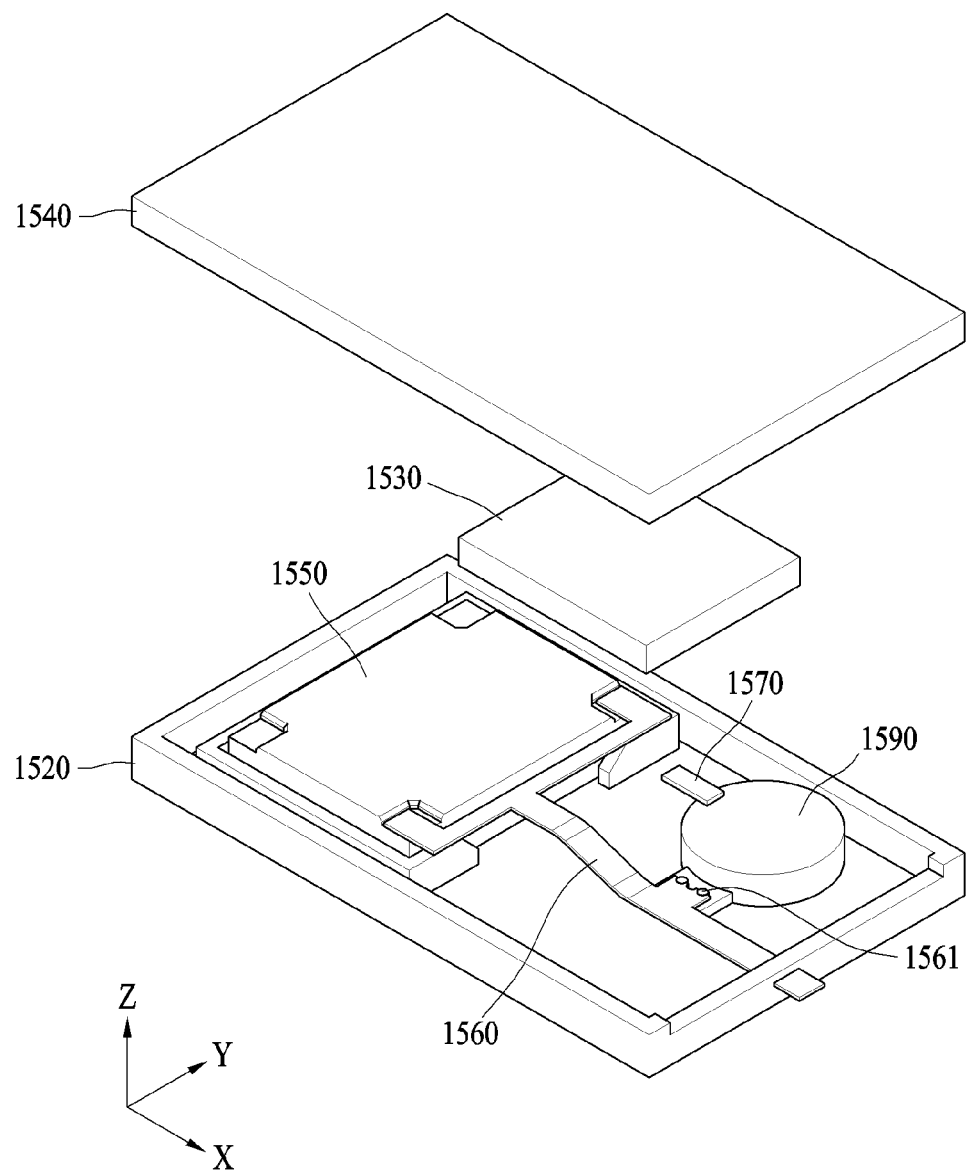
FIG. 15A is an exploded perspective view of a speaker including a porous sheet according to an embodiment of the disclosure.

FIG. 15A is an exploded perspective view of a speaker including a porous sheet according to an embodiment of the disclosure.

Figure 15B:
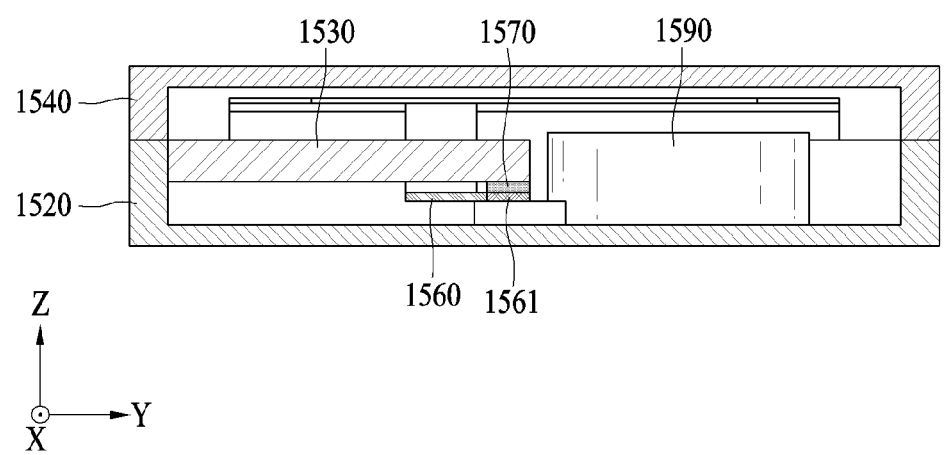
FIG. 15B is a cross-sectional view of a speaker including a porous sheet according to an embodiment of the disclosure.

FIG. 15B is a cross-sectional view of a speaker including a porous sheet according to an embodiment of the disclosure.

Referring to FIGS. 15A and 15B, the speaker may include a main body 1520, a porous sheet 1530 inserted into the main body 1520, a cover 1540 connected to the main body 1520 to cover the porous sheet 1530, a sound generator 1550 disposed inside the main body 1520, a PCB 1560 electrically connected to the sound generator 1550, an electronic element 1590, which is disposed in the main body 1520, provided at a position spaced apart from the sound generator 1550 and connected to the PCB 1560, and a non-conductive part 1570 disposed between the PCB 1560 and the porous sheet 1530. The PCB 1560 may be a flexible printed circuit board. The PCB 1560 may include a connection pad 1561 that is physically and electrically connected to the electronic element 1590.

The electronic element 1590 may be, for example, an electronic component including an integrated circuit.

The non-conductive part 1570 may be disposed between the porous sheet 1530 and a connection portion of the electronic element 1590 and the PCB 1560. The non-conductive part 1570 may block the connection portion of the electronic element 1590 and the PCB 1560 from being electrically connected to the porous sheet 1530. For example, the non-conductive part 1570 may include an insulating material. For example, the non-conductive part 1570 may be an insulating adhesive, for example, an insulating glue. For example, the non-conductive part 1570 may include an insulating material and may have a shape of a sheet formed of a flexible material. For example, the non-conductive part 1570 may include an insulating material and may have a shape of a plate formed of a rigid material.

The non-conductive part 1570 is illustrated as being disposed between the porous sheet 1530 and the connection portion of the electronic element 1590 and the PCB 1560, however, the example embodiments are not limited thereto. For example, when the porous sheet 1530 is disposed on the sound generator 1550, the non-conductive part 1570 may also be disposed between the porous sheet 1530 and the sound generator 1550.

The porous sheet 1530 may be provided at a position spaced apart from a terminal in a direction, for example, the x-axis direction or the y-axis direction, orthogonal to the z-axis direction that is a direction in which the porous sheet 1530 is inserted into the main body 1520.

Although one porous sheet 1530 is illustrated, the example embodiments are not limited thereto. For example, a plurality of porous sheets 1530 may be provided.

According to various example embodiments, in an electronic device including a speaker with a porous sheet, a speaker 310 may include a main body 320, a sound generator 350, which includes a suspension 352 disposed inside the main body, a voice coil 353 connected to the suspension, a sound body 351 surrounding the voice coil and a terminal 354 connected to the suspension and at least partially exposed to the outside of the sound body, a PCB 360 connected to the terminal and extending outwardly from the main body, and a porous sheet 330 inserted into the main body and spaced apart from the terminal.

In various example embodiments, the speaker 310 may further include a non-conductive part 370 disposed between the PCB 360 and the porous sheet 330.

In various example embodiments, the PCB 360 may include a contact part 361 connected to the terminal, and an extension part 362 extending from the contact part.

In various example embodiments, the non-conductive part 370 may be disposed on the contact part to attach the porous sheet and the contact part.

In various example embodiments, the non-conductive part 470 may be disposed on the sound body, and at least a portion of the non-conductive part 470 may cover the contact part.

In various example embodiments, the non-conductive part 570 may include a non-conductive body 571 disposed on the sound body, and a protrusion 572 formed to protrude from one end portion of the non-conductive body toward the contact part.

In various example embodiments, the non-conductive part 670 may be a coating layer applied onto one surface of the PCB.

In various example embodiments, the sound body 351 may include a body groove 351b that is recessed from a surface 351a of the sound body 351 facing the porous sheet to support the terminal.

In various example embodiments, the terminal 754 may be disposed at an opposite side of the porous sheet 730 with respect to a surface of the sound body 751 facing the porous sheet.

In various example embodiments, the main body 320 may include a base plate 321, and an outer wall 322 formed to protrude from the base plate and surround the porous sheet.

In various example embodiments, the main body 920 may further include a main hole 924 formed to penetrate the base plate 921 to expose at least a portion of the sound body to the outside, and a terminal hole 925 formed to penetrate the base plate 921 to expose the terminal to the outside. The terminal 954 and the porous sheet 930 may be provided on opposite sides with respect to the suspension 952.

In various example embodiments, the porous sheet 1030 may be provided at a position spaced apart from the terminal 1054 in a direction orthogonal to a direction in which the porous sheet is inserted into the main body.

In various example embodiments, the main body 1020 may further include fixing rods 1026 and 1027 formed to protrude from the base plate and penetrate the porous sheet.

In various example embodiments, the speaker 1210 may further include a plurality of porous capsules 1282 configured to fill a space between the porous sheet and the outer wall and provided on an opposite side of the sound generator with respect to the porous sheet.

In various example embodiments, the speaker may further include an antenna pattern 1390, 1490 spaced apart from the porous sheet in a direction crossing the direction in which the porous sheet is inserted into the main body.

According to various example embodiments, a speaker 310 including a porous sheet may include a main body 320, a sound generator 350, which includes a suspension disposed inside the main body, a voice coil connected to the suspension, a sound body surrounding the voice coil, and a terminal connected to the suspension and at least partially exposed to the outside of the sound body, a PCB 360, which includes a contact part connected to the terminal and an extension part extending from the contact part, a porous sheet 330 inserted into the main body, a cover 340 connected to the main body to cover the porous sheet, and a non-conductive part 370 disposed between the PCB and the porous sheet.

In various example embodiments, the non-conductive part 370 may be disposed on the contact part to attach the porous sheet and the contact part.

In various example embodiments, the non-conductive part 470 may be disposed on the sound body, and at least a portion of the non-conductive part 470 may cover the contact part.

In various example embodiments, the speaker may further include an electronic element 1590 disposed on the main body, provided at a position spaced apart from the sound generator, and connected to the PCB. The non-conductive part 1570 may be disposed between the porous sheet and a connection portion of the electronic element and the PCB.

According to various example embodiments, in an electronic device including a speaker with a porous sheet, the speaker 310 may include a main body 320, which includes a base plate and an outer wall formed to protrude from the base plate, a sound generator 350, which includes a suspension disposed inside the main body, a voice coil connected to the suspension, a sound body surrounding the voice coil, and a terminal connected to the suspension and at least partially exposed to the outside of the sound body, a PCB 360 connected to the terminal and extending to the outside of the main body, a porous sheet 330 inserted into the main body and surrounded by the outer wall, a cover 340 connected to the main body to cover the porous sheet, and a non-conductive part 370 disposed between the PCB and the porous sheet to block a contact between the PCB and the porous sheet.

While the disclosure has been shown and described with reference to various embodiments thereof, it will be understood by those skilled in the art that various changes in form and details may be made therein without departing from the spirit and scope of the disclosure as defined by the appended claims and their equivalents.

What is claimed is:

1. An electronic device including a speaker with a porous sheet, wherein the speaker comprises:
    a main body;
    a sound generator comprising:
        a voice coil,
        a sound body surrounding the voice coil, and
        a terminal that is at least partially exposed to an outside of the sound body;
    a printed circuit board (PCB) connected to the terminal and extending outwardly from the main body; and
    a porous sheet inserted into the main body and spaced apart from the terminal.

2. The electronic device of claim 1, wherein the speaker further comprises a non-conductive part disposed between the PCB and the porous sheet.

3. The electronic device of claim 2, wherein the PCB comprises:
    a contact part connected to the terminal; and
    an extension part extending from the contact part.

4. The electronic device of claim 3,
    wherein the non-conductive part is disposed on the contact part, and
    wherein the non-conductive part is configured to attach the porous sheet and the contact part.

5. The electronic device of claim 3,
    wherein the non-conductive part is disposed on the sound body, and
    wherein at least a portion of the non-conductive part covers the contact part.

6. The electronic device of claim 3, wherein the non-conductive part comprises:
    a non-conductive body disposed on the sound body; and
    a protrusion formed to protrude from one end portion of the non-conductive body toward the contact part.

7. The electronic device of claim 2, wherein the non-conductive part is a coating layer applied onto one surface of the PCB.

8. The electronic device of claim 1,
    wherein the sound body comprises a body groove formed to be recessed from a surface of the sound body facing the porous sheet, and
    wherein the body groove is configured to support the terminal.

9. The electronic device of claim 1, wherein the terminal is disposed at an opposite side of the porous sheet with respect to a surface of the sound body facing the porous sheet.

10. The electronic device of claim 1, wherein the main body comprises:
    a base plate; and an outer wall formed to protrude from the base plate and surround the porous sheet.

11. The electronic device of claim 10, wherein the main body further comprises:
a main hole formed to penetrate the base plate, the main hole configured to expose at least a portion of the sound body to the outside; and
a terminal hole formed to penetrate the base plate, the terminal hole configured to expose the terminal to the outside.

12. The electronic device of claim 10, wherein the porous sheet is provided at a position spaced apart from the terminal in a direction orthogonal to a direction in which the porous sheet is inserted into the main body.

13. The electronic device of claim 10, wherein the main body further comprises a fixing rod formed to protrude from the base plate and penetrate the porous sheet.

14. The electronic device of claim 10, wherein the speaker further comprises a plurality of porous capsules configured to fill a space between the porous sheet and the outer wall and provided on an opposite side of the sound generator with respect to the porous sheet.

15. The electronic device of claim 1, wherein the speaker further comprises an antenna pattern spaced apart from the porous sheet in a direction crossing a direction in which the porous sheet is inserted into the main body.

16. A speaker with a porous sheet, the speaker comprising:
a main body;
a sound generator comprising:
a voice coil,
a sound body surrounding the voice coil, and
a terminal that is at least partially exposed to an outside of the sound body;
a printed circuit board (PCB) comprising a contact part connected to the terminal, and an extension part extending from the contact part;
a porous sheet inserted into the main body;
a cover connected to the main body, the cover configured to cover the porous sheet; and
a non-conductive part disposed between the PCB and the porous sheet.

17. The speaker of claim 16,
wherein the non-conductive part is disposed on the contact part, and
wherein the non-conductive part is configured to attach the porous sheet and the contact part.

18. The speaker of claim 16,
wherein the non-conductive part is disposed on the sound body, and
wherein at least a portion of the non-conductive part covers the contact part.

19. The speaker of claim 16, further comprising:
an electronic element provided at a position spaced apart from the sound generator and connected to the PCB,
wherein the non-conductive part is disposed between the porous sheet and a connection portion of the electronic element and the PCB.

20. An electronic device including a speaker with a porous sheet, wherein the speaker comprises:
a main body comprising a base plate, and an outer wall formed to protrude from the base plate;
a sound generator comprising:
a voice coil,
a sound body surrounding the voice coil, and
a terminal that is at least partially exposed to an outside of the sound body;
a printed circuit board (PCB) connected to the terminal and extending outwardly from the main body;
a porous sheet inserted into the main body and surrounded by the outer wall;
a cover connected to the main body and configured to cover the porous sheet; and
a non-conductive part disposed between the PCB and the porous sheet, and the non-conductive part configured to block a contact between the PCB and the porous sheet.

21. The electronic device of claim 20, wherein the porous sheet is configured to adsorb at least a portion of the air of an inner space of the speaker.

22. The electronic device of claim 21,
wherein the porous sheet includes an air adsorption material, and
wherein the air adsorption material is an activated carbon-based material having a specific surface area of 1500 m2/g or greater.

23. The electronic device of claim 22, wherein the porous sheet has a shape corresponding to an inner shape of the outer wall.

* * * * *